(12) United States Patent
Shinohara et al.

(10) Patent No.: US 8,492,186 B2
(45) Date of Patent: Jul. 23, 2013

(54) METHOD FOR PRODUCING GROUP III NITRIDE SEMICONDUCTOR LAYER, GROUP III NITRIDE SEMICONDUCTOR LIGHT-EMITTING DEVICE, AND LAMP

(75) Inventors: Hironao Shinohara, Ichihara (JP); Hiromitsu Sakai, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 271 days.

(21) Appl. No.: 12/515,157

(22) PCT Filed: Dec. 19, 2007

(86) PCT No.: PCT/JP2007/074411
§ 371 (c)(1),
(2), (4) Date: May 15, 2009

(87) PCT Pub. No.: WO2008/081717
PCT Pub. Date: Jul. 10, 2008

(65) Prior Publication Data
US 2010/0025684 A1 Feb. 4, 2010

(30) Foreign Application Priority Data

Dec. 22, 2006 (JP) ................ 2006-346000
Aug. 30, 2007 (JP) ................ 2007-224496
Oct. 22, 2007 (JP) ................ 2007-274376
Nov. 2, 2007 (JP) ................ 2007-286690

(51) Int. Cl.
*H01L 33/00* (2010.01)
*H01L 21/20* (2006.01)

(52) U.S. Cl.
USPC ............. 438/44; 438/478; 438/22; 438/42; 438/41; 438/481; 438/700; 438/704; 257/E21.001; 257/E21.121; 257/E21.229; 257/E21.214; 257/E21.701; 257/E21.023

(58) Field of Classification Search
USPC ......... 257/49, E21.09, E33.003, 95, E21.001, 257/E21.121, E21.229, E21.214, E21.701, 257/E21.023; 438/478, 22, 42, 44, 41, 481, 438/700, 704, E21.001, E21.121, E21.229, 438/E21.214, E21.701
See application file for complete search history.

(56) References Cited

U.S. PATENT DOCUMENTS 5,668,587 A 9/1997 Hammond et al.
6,476,726 B1 11/2002 Pederson
(Continued)

FOREIGN PATENT DOCUMENTS

CN 1610135 A 4/2005
EP 1 296 363 A1 3/2003
(Continued)

OTHER PUBLICATIONS

B. Liu, et al.; "Imaging of defect-mediated surface morphology of GaN(0001) grown on sapphire by molecular beam epitaxy"; Journal of Applied Physics; vol. 97, 023509 (2005); pp. 023509-1 to 023509-8.

(Continued)

*Primary Examiner* — Matthew Reames
*Assistant Examiner* — Benjamin Tzu-Hung Liu
(74) *Attorney, Agent, or Firm* — Sughrue Mion, PLLC

(57) ABSTRACT

The present invention is a method for producing a group III nitride semiconductor layer in which a single crystal group III nitride semiconductor layer (103) is formed on a substrate (101), the method including: a substrate processing step of forming, on the (0001) C-plane of the substrate (101), a plurality of convex parts (12) of surfaces (12c) not parallel to the C-plane, to thereby form, on the substrate, an upper surface (10) that is composed of the convex parts (12) and a flat surface (11) of the C-plane; and an epitaxial step of epitaxially growing the group III nitride semiconductor layer (103) on the upper surface (10), to thereby embed the convex parts (12) in the group III nitride semiconductor layer (103).

2 Claims, 3 Drawing Sheets

U.S. PATENT DOCUMENTS

| | | | |
|---|---|---|---|
| 6,841,808 B2 * | 1/2005 | Shibata et al. | 257/190 |
| 7,470,938 B2 * | 12/2008 | Lee et al. | 257/103 |
| 7,683,386 B2 * | 3/2010 | Tanaka et al. | 257/88 |
| 7,759,140 B2 * | 7/2010 | Lee et al. | 438/22 |
| 7,872,274 B2 * | 1/2011 | Murai et al. | 257/99 |
| 2003/0109076 A1 | 6/2003 | Senda et al. | |
| 2004/0113166 A1 | 6/2004 | Tadatomo et al. | |
| 2005/0082546 A1 | 4/2005 | Lee et al. | |
| 2005/0104081 A1 * | 5/2005 | Kim et al. | 257/99 |
| 2005/0179130 A1 | 8/2005 | Tanaka et al. | |
| 2005/0221521 A1 | 10/2005 | Lee et al. | |
| 2006/0006408 A1 | 1/2006 | Suehiro et al. | |

FOREIGN PATENT DOCUMENTS

| | | | |
|---|---|---|---|
| JP | 60-173829 A | 9/1985 | |
| JP | 04350156 A | 12/1992 | |
| JP | 05166794 A | 7/1993 | |
| JP | 6-177039 A | 6/1994 | |
| JP | 7-508142 A | 9/1995 | |
| JP | 10-84167 A | 3/1998 | |
| JP | 2836687 B2 | 10/1998 | |
| JP | 11-45892 A | 2/1999 | |
| JP | 11-312825 A | 11/1999 | |
| JP | 2001-094150 A | 4/2001 | |
| JP | 2001-308010 A | 11/2001 | |
| JP | 2002-280611 A | 9/2002 | |
| JP | 2002302764 A | 10/2002 | |
| JP | 2002-368344 A | 12/2002 | |
| JP | 2003-197961 A | 7/2003 | |
| JP | 2004176110 A | 6/2004 | |
| JP | 2005-064492 A | 3/2005 | |
| JP | 2005-101566 A | 4/2005 | |
| JP | 2005-136106 A | 5/2005 | |
| JP | 2006-60164 A | 3/2006 | |
| JP | 2006-120841 A | 5/2006 | |
| JP | 2006-196543 A | 7/2006 | |
| JP | 2006-210578 A | 8/2006 | |
| JP | 2006-313944 A | 11/2006 | |
| KR | 10-2005-0038207 A | 4/2005 | |
| WO | 94/24697 A1 | 10/1994 | |

OTHER PUBLICATIONS

S.Z. Wang, et al.; "20 meV-deep donor level in InN film of 0.76 eV band gap grown by plasma-assisted nitrogen source"; Journal of Applied Physics; vol. 95; No. 12; Jun. 15, 2004; pp. 7998-8001.

Christian Heinlein, et al.; "Preconditioning of c-plane sapphire for GaN epitaxy by radio frequency plasma nitridation"; Applied Physics Letters; vol. 71, No. 3; Jul. 21, 1997; pp. 341-343.

Christian Heinlein, et al.; "Preconditioning of c-plane sapphire for GaN molecular beam epitaxy by electron cyclotron resonance plasma nitridation"; Journal of Applied Physics; vol. 83; No. 11; Jun. 1, 1998; pp. 6023-6027.

Chinese Office Action dated Jun. 22, 2011 for corresponding Chinese Patent Application No. 200780045961.2.

Taiwanese Office Action issued on Mar. 19, 2012 for corresponding Taiwanese Application No. 096148970.

Japanese Notice of Allowance dated Mar. 12, 2013 in corresponding Japanese Application No. 2010-162852.

* cited by examiner

METHOD FOR PRODUCING GROUP III NITRIDE SEMICONDUCTOR LAYER, GROUP III NITRIDE SEMICONDUCTOR LIGHT-EMITTING DEVICE, AND LAMP

TECHNICAL FIELD

The present invention relates to a method for producing a group III nitride semiconductor layer which is suitably used for light-emitting devices such as a light emitting diode (LED), a group III nitride semiconductor light-emitting device, and a lamp.

Priority is claimed on Japanese Patent Application No. 2006-346000, filed Dec. 22, 2006, Japanese Patent Application No. 2007-224496, filed Aug. 30, 2007, Japanese Patent Application No. 2007-274376, filed Oct. 22, 2007, and Japanese Patent Application No. 2007-286690, filed Nov. 2, 2007, the contents of which are incorporated herein by reference.

BACKGROUND ART

In recent years, group III nitride semiconductors have become of interest as a semiconductor material for a light-emitting device that emits light of short wavelength. Such a group III nitride semiconductor is represented by the general formula $Al_xGa_yIn_zN$ ($0 \leq x \leq 1$, $0 \leq y \leq 1$, $0 \leq z \leq 1$, and $x+y+z=1$), and is grown on a substrate of a single crystal sapphire, a variety of oxides, or a group III-V compound, through a metal-organic chemical vapor deposition method (MOCVD method), a molecular-beam epitaxy method (MBE method), or the like.

In a general light-emitting device using a group III nitride semiconductor, an n-type semiconductor layer, a light-emitting layer, and a p-type semiconductor layer, each of which is made of a group III nitride semiconductor, are laminated in this order on a single crystal sapphire substrate. Since such a sapphire substrate is an insulator, the device structure generally takes a structure in which a positive electrode formed on the p-type semiconductor layer and a negative electrode formed on the n-type semiconductor layer are present in the same plane. There are two types of such a group III nitride semiconductor light-emitting device: face up type in which a transparent electrode is used as a positive electrode to extract light from the p-type semiconductor side; and flip chip type in which a high reflective film of Ag or the like is used as a positive electrode to extract light from the sapphire substrate side.

External quantum efficiency is used as an index of the output from such a light-emitting device. It can be said that higher external quantum efficiency means a light-emitting device with higher output. The external quantum efficiency is represented as the multiplication of internal quantum efficiency and light extraction efficiency. The internal quantum efficiency is the proportion of energy converted into light in the light-emitting layer amongst energy of electrical current injected into the device. The light extraction efficiency is the proportion of light that can be extracted to the outside of the light-emitting device amongst light generated in the light-emitting layer. Accordingly, in order to improve the external quantum efficiency, the light extraction efficiency needs to be improved.

There are mainly two ways to improve the light extraction efficiency. One is a method for reducing absorption of light into an electrode or the like formed on the light extraction surface. The other one is a method for reducing light confinement within the light-emitting device occurring due to a difference in the refractive index between the light-emitting device and a medium outside of it.

When a transparent electrode is to be provided on a p-type semiconductor so as to improve the light extraction efficiency of a light-emitting device, a metal transparent electrode of Ni/Au or the like has been conventionally used. However, recently, an electrode made of a transparent conductive oxide film of ITO or the like has been used instead. One of the reasons why a metal transparent electrode of Ni/Au or the like has been replaced by a transparent conductive oxide film of ITO or the like, is that the absorption of emitted light can be reduced by using the transparent conductive oxide film.

In addition, as to the method for reducing light confinement within the light-emitting device, a technique for forming a concavo-convex surface on the light extraction surface of the light-emitting device can be enumerated (for example, refer to Patent Document 1).

However, in the light-emitting element in which a concavo-convex surface has been formed on the light extraction surface by means of mechanical or chemical processing, the processing on the light extraction surface causes overloading on the semiconductor layer, leaving damage in the light-emitting layer. In addition, in the light-emitting device in which the semiconductor layer has been grown under such a condition that allows a concavo-convex surface to be formed on the light extraction surface, the crystallinity of the semiconductor layer is deteriorated and thus the light-emitting layer ends up being defective. Therefore, if a concavo-convex surface is formed on the light extraction surface, although the light extraction efficiency is improved, there is a problem in that the internal quantum efficiency is lowered, and thus an increase in the emission intensity can not be achieved.

Here, instead of forming a concavo-convex surface on the light extraction surface, a method for forming a concavo-convex surface on the surface of the sapphire substrate to grow a group III nitride semiconductor layer thereon, has been proposed (for example, refer to Patent Document 2). In this method, the interface between the sapphire substrate and the group III nitride semiconductor layer becomes concavo-convex, and the difference in the refractive index between the sapphire substrate and the group III nitride semiconductor layer causes diffuse reflection of light in the interface, which can reduce the light confinement within the light-emitting device and can improve the light extraction efficiency.

[Patent Document 1] Japanese Patent Publication No. 2836687

[Patent Document 2] Japanese Unexamined Patent Application, First Publication No. 2002-280611

DISCLOSURE OF INVENTION

Problems to be Solved by the Invention

However, if a concavo-convex surface is formed on the surface of the sapphire substrate and a single crystal group III nitride semiconductor layer is epitaxially grown thereon, there has been a problem in that the surface becomes flat which makes it difficult to grow a group III nitride semiconductor layer with excellent crystallinity.

For example, if convex parts are formed on the C-plane of the sapphire substrate and a single crystal GaN-containing group III nitride semiconductor layer is epitaxially grown thereon, then crystal defects such as dislocation are apt to occur in a portion where a semiconductor layer grown from the C-plane located on the apex portion of the convex part and a semiconductor layer grown from the C-plane located around the base portion of the convex part are integrated, which makes it difficult to grow a semiconductor layer with excellent crystallinity.

In addition, the crystallinity of the single crystal group III nitride semiconductor layer grown on the substrate affects the crystallinity of the semiconductor layer composed of an n-type layer, a light-emitting layer, and a p-type layer that constitute the LED structure laminated on the group III nitride semiconductor layer. For this reason, the crystallinity of the LED structure also becomes inferior unless the crystallinity of the single crystal group III nitride semiconductor layer grown on the substrate becomes satisfactory. As a result, if a concavo-convex surface is formed on the surface of the sapphire substrate, although the light extraction efficiency of the light-emitting device is improved, the internal quantum efficiency might be lowered and the LED leakage current might be increased.

The present invention takes the above problems into consideration with an object of providing a method for producing a group III nitride semiconductor layer, capable of yielding a group III nitride semiconductor layer with excellent crystallinity which can be suitably used for forming a light-emitting device having excellent internal quantum efficiency and light extraction efficiency.

In addition, another object is to provide a group III nitride semiconductor light-emitting device having excellent internal quantum efficiency and light extraction efficiency with less leakage, in which an LED structure is formed on the group III nitride semiconductor layer produced by the abovementioned production method.

Yet another object is to provide a lamp comprising the abovementioned group III nitride semiconductor light-emitting device.

Means to Solve the Problems

To solve the above problems, the inventors of the present invention have conducted intensive studies. As a result, they have completed the present invention. That is, the present invention relates to the following.
(1) A method for producing a group III nitride semiconductor layer in which a single crystal group III nitride semiconductor layer is formed on a substrate, the method comprising: a substrate processing step of forming, on the (0001) C-plane of the substrate, a plurality of convex parts of surfaces not parallel to the C-plane, to thereby form, on the substrate, an upper surface that is composed of the convex parts and a flat surface of the C-plane; and an epitaxial step of epitaxially growing the group III nitride semiconductor layer on the upper surface, to thereby embed the convex parts in the group III nitride semiconductor layer.
(2) The method for producing a group III nitride semiconductor layer according to (1), wherein the convex part has a base portion width of 0.05 to 5 μm and a height of 0.05 to 5 μm, the height is not smaller than ¼ of the base portion width, and an interval between the adjacent convex parts is 0.5 to 5 times the base portion width.
(3) The method for producing a group III nitride semiconductor layer according to any one of (1) and (2), wherein the convex part has a shape whose external contour becomes upwardly gradually smaller.
(4) The method for producing a group III nitride semiconductor layer according to any one of (1) through (3), wherein the convex part has an approximately conical shape or an approximately polygonal pyramid shape.
(5) The method for producing a group III nitride semiconductor layer according to any one of (1) through (4), wherein the substrate is a sapphire substrate.
(6) The method for producing a group III nitride semiconductor layer according to any one of (1) through (5), further comprising, after the substrate processing step and before the epitaxial step, a buffer layer formation step of laminating, on the upper surface, a buffer layer of polycrystal $Al_xGa_{1-x}N$ ($0 \leqq x \leqq 1$) in a thickness of 0.01 to 0.5 μm by a sputtering method.
(7) The method for producing a group III nitride semiconductor layer according to any one of (1) through (5), further comprising, after the substrate processing step and before the epitaxial step, a buffer layer formation step of laminating, on the upper surface, a buffer layer having a single crystal structure of $Al_xGa_{1-x}N$ ($0 \leqq x \leqq 1$) in a thickness of 0.01 to 0.5 μm by a sputtering method.
(8) A group III nitride semiconductor light-emitting device in which an LED structure is formed on a single crystal group III nitride semiconductor layer that has been formed on a substrate, wherein the substrate has an upper surface that is composed of a flat surface of the C-plane and a plurality of convex parts of surfaces not parallel to the C-plane, and the group III nitride semiconductor layer is formed by epitaxially growing, on the upper surface, the group III nitride semiconductor layer for embedding the convex parts.
(9) The group III nitride semiconductor light-emitting device according to (8), wherein the convex part has a base portion width of 0.05 to 5 μm and a height of 0.05 to 5 μm, the height is not smaller than ¼ of the base portion width, and an interval between the adjacent convex parts is 0.5 to 5 times the base portion width.
(10) The group III nitride semiconductor light-emitting device according to either one of (8) and (9), wherein the convex part has a shape whose external contour becomes upwardly gradually smaller.
(11) The group III nitride semiconductor light-emitting device according to any one of (8) through (10), wherein the convex part has an approximately conical shape or an approximately polygonal pyramid shape.
(12) The group III nitride semiconductor light-emitting device according to any one of (8) through (11), wherein the substrate is a sapphire substrate.
(13) The group III nitride semiconductor light-emitting device according to any one of (8) through (12), comprising a buffer layer of polycrystal $Al_xGa_{1-x}N$ ($0 \leqq x \leqq 1$) in a thickness of 0.01 to 0.5 μm on the upper surface.
(14) The group III nitride semiconductor light-emitting device according to any one of (8) through (12), comprising a buffer layer having a single crystal structure of $Al_xGa_{1-x}N$ ($0 \leqq x \leqq 1$) in a thickness of 0.01 to 0.5 μm on the upper surface.
(15) The group III nitride semiconductor light-emitting device according to any one of (13) and (14), wherein the buffer layer is laminated by a sputtering method.
(16) The group III nitride semiconductor light-emitting device according to any one of (8) through (14), wherein the LED structure has an n-type layer, a light-emitting layer, and a p-type layer, each of which is made of a group III nitride semiconductor.
(17) The group III nitride semiconductor light-emitting device according to (15), wherein the n-type layer comprises an n-clad layer, the p-type layer comprises a p-clad layer, and the n-clad layer and/or the p-clad layer include at least a superlattice structure.

(18) A lamp comprising the group III nitride semiconductor light-emitting device according to any one of (8) through (17).

(19) Use of the group III nitride semiconductor light-emitting device according to any one of (8) through (17) in the production of a lamp.

Effect of the Invention

The method for producing a group III nitride semiconductor layer of the present invention comprises the substrate processing step of forming a plurality of convex parts of surfaces not parallel to the (0001) C-plane of the substrate, on the C-plane, to thereby form an upper surface that is composed of the convex parts and a flat surface of the C-plane, on the substrate. Therefore, by performing an epitaxial step of epitaxially growing the group III nitride semiconductor layer on the upper surface to thereby embed the convex parts in the group III nitride semiconductor layer, a group III nitride semiconductor layer with excellent crystallinity, which can be suitably used for forming a light-emitting device having excellent internal quantum efficiency and light extraction efficiency, can be obtained.

In addition, in the group III nitride semiconductor light-emitting device of the present invention, the substrate has an upper surface that is composed of a flat surface of the C-plane and a plurality of convex parts of surfaces not parallel to the C-plane, and the group III nitride semiconductor layer is formed by epitaxially growing the group III nitride semiconductor layer for embedding the convex parts, on the upper surface. Therefore, the interface between the substrate and the group III nitride semiconductor layer is made concavo-convex, and thus light confinement within the light-emitting device can be reduced by diffuse reflection of light in the interface. Accordingly, excellent light extraction efficiency can be achieved.

Moreover, the group III nitride semiconductor light-emitting device of the present invention has an LED structure with excellent crystallinity. Therefore, lowering of the internal quantum efficiency can be prevented and the leakage current can be reduced, so that a light-emitting device with high output and excellent electrical characteristic can be achieved.

Furthermore, in the present invention, since the layer structure is made such that the n-clad layer and/or the p-clad layer include(s) a superlattice structure, a light-emitting device with remarkably improved output and excellent electrical characteristic can be achieved.

Moreover, since the lamp of the present invention comprises the group III nitride semiconductor light-emitting device of the present invention, excellent light emission characteristic can be achieved.

DESCRIPTION OF THE REFERENCE SYMBOLS

| | |
|---|---|
| 1: | Group III nitride semiconductor light-emitting device |
| 10: | Upper surface |
| 11: | Flat surface |
| 12: | Convex part |
| 12c: | Surface |
| 20: | LED structure |
| 101: | Substrate |
| 102: | Buffer layer |
| 103: | Group III nitride semiconductor layer |
| 104: | N-type layer |
| 104b: | N-clad layer |
| 105: | Light-emitting layer |
| 106: | P-type layer |
| 106a: | P-clad layer |
| 107: | Positive electrode bonding pad |
| 108: | Negative electrode bonding pad |
| 3: | Lamp |

BEST MODE FOR CARRYING OUT THE INVENTION

Hereunder is a description of one embodiment of a method for producing a group III nitride semiconductor layer, a group III nitride semiconductor light-emitting device, and a lamp according to the present invention, appropriately with reference to the drawings.

Figure 1:
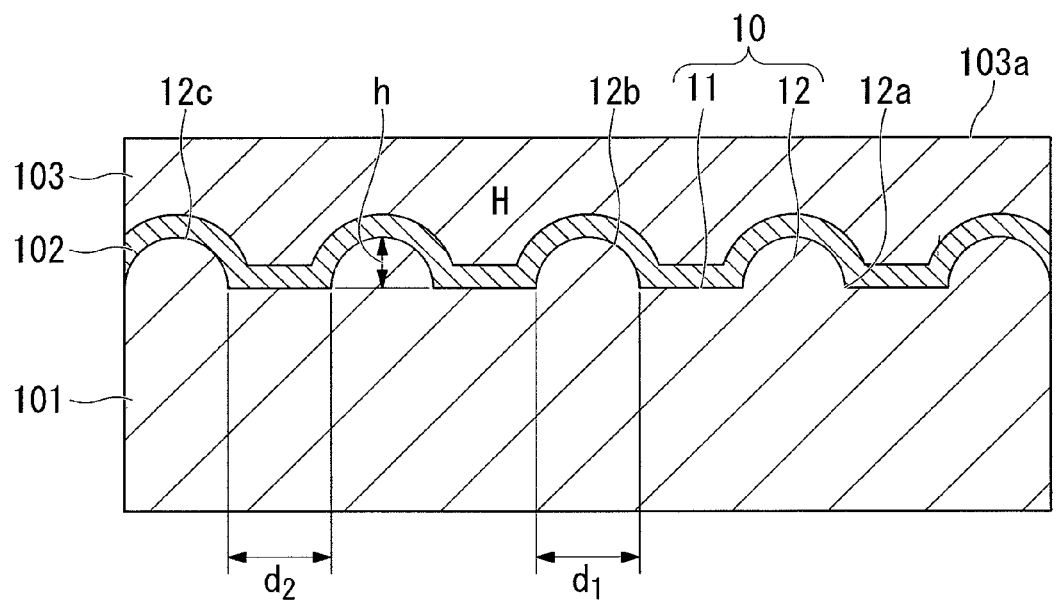
FIG. 1 is a diagram for explaining an example of a method for producing a group III nitride semiconductor layer of the present invention, being a cross-sectional view showing a laminated structure in which a buffer layer and a single crystal group III nitride semiconductor layer are formed on a substrate surface by the production method of the present invention.

FIG. 1 is a diagram for explaining an example of the method for producing a group III nitride semiconductor layer of the present invention, being a cross-sectional view showing a laminated structure in which a buffer layer and a single crystal group III nitride semiconductor layer are formed on a substrate surface by the production method of the present invention. In FIG. 1, reference symbol 101 denotes the substrate, reference symbol 102 denotes the buffer layer, and reference symbol 103 denotes the group III nitride semiconductor layer.

[Method for Manufacturing Group III Nitride Semiconductor Layer]

(Substrate Processing Step)

Figure 2:
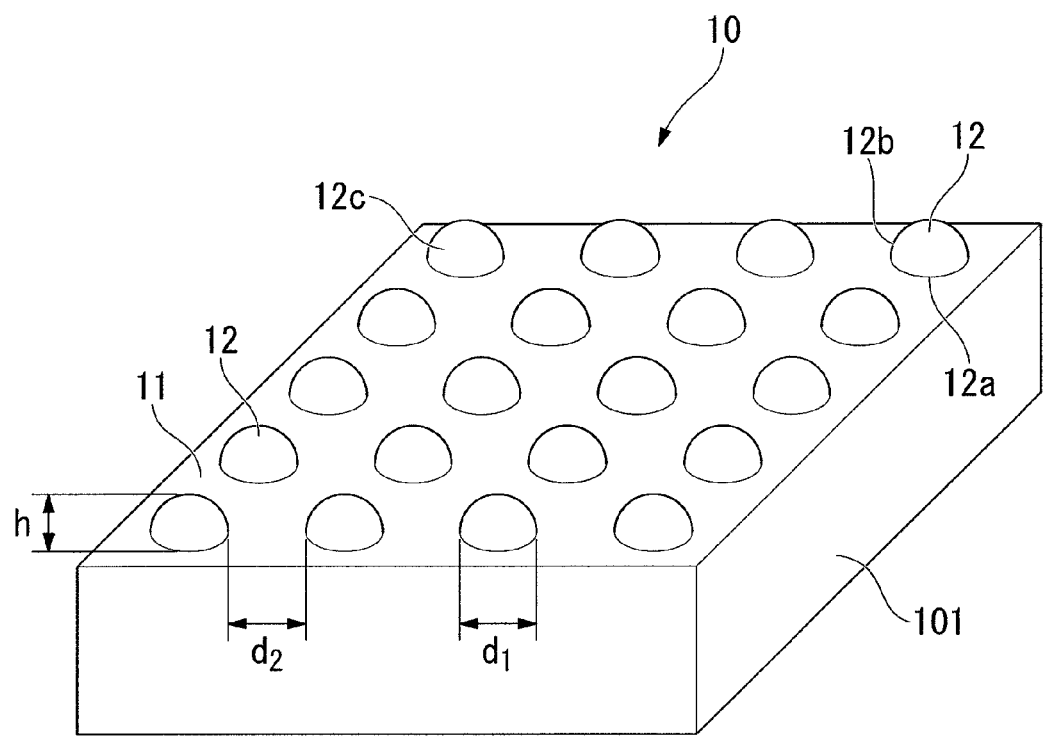
FIG. 2 is a diagram for explaining an example of a process for producing the laminated structure shown in FIG. 1, being a perspective view showing the substrate on which a substrate processing step of this embodiment has been completed.

FIG. 2 is a diagram for explaining an example of a process for producing the laminated structure shown in FIG. 1, being a perspective view showing the substrate on which a substrate processing step of this embodiment has been completed.

In the substrate processing step, on the (0001) C-plane of the substrate, a plurality of convex parts of surfaces not parallel to the C-plane are formed, by which, as shown in FIG. 1 and FIG. 2, an upper surface 10 that is composed of convex parts 12 and a flat surface 11 of the C-plane is formed on the substrate 101. The substrate processing step performs: a patterning step of forming a mask which defines the planar arrangement of the convex parts 12 on the substrate 101; and an etching step of etching the substrate 101 with use of the mask formed in the patterning step so as to form the convex parts 12.

In this embodiment, for the substrate 101 for forming the plurality of convex parts 12 thereon, a single crystal sapphire wafer having the (0001) C-plane as the surface is employed. Here, the term "substrate having the (0001) C-plane as the surface" can include an off-axis substrate the plane direction of which is angled with respect to the (0001) direction within a range of ±3°. In addition, the term "surface not parallel to the C-plane" means a surface which does not have a surface parallel to the (0001) C-plane within a range of ±3°.

The patterning step can be performed by a general photolithographic method. The base portion width $d_1$ of the base portion 12a of the convex part 12 to be formed in the substrate processing step is preferably 5 μm or less. Therefore, in order to make a uniform patterning on the whole surface of the substrate 101, a stepper exposure method amongst photolithographic methods is preferably employed. However, in order to form a pattern of convex parts 12 at base portion widths $d_1$ of 1 μm or less, an expensive stepper apparatus is required and the cost is incremented. For this reason, upon the formation of a pattern of convex parts at widths of $d_1$ of 1 μm or less, a laser exposure method or a nano-imprinting method for use in the field of optical disks is preferably employed.

As to the method for etching the substrate 101 in the etching step, there can be enumerated dry etching and wet etching. If wet etching is employed as the etching method, it is difficult to form the convex parts 12 of surfaces 12c not parallel to the C-plane since the crystal plane of the substrate 101 is exposed. Accordingly, dry etching is preferably employed.

The convex parts 12 of surfaces 12c not parallel to the C-plane can be formed by a method for dry-etching the substrate 101 until elimination of the mask formed in the patterning step mentioned above. More specifically, for example, the convex parts 12 can be formed by the following method. On the substrate 101, a resist is formed and patterning is made in a predetermined shape, followed by postbaking in which heat treatment at 110° C. for 30 minutes is performed, for example, in an oven, so that side faces of the resist become tapered. Subsequently, dry etching is performed under a predetermined condition for promoting the lateral etching until the resist is eliminated.

In addition, the convex parts 12 of surfaces 12c not parallel to the C-plane can also be formed by a method for dry-etching the substrate with use of the mask, followed by peeling-off of the mask and repeated dry-etching of the substrate 101. More specifically, for example, the convex parts 12 can be formed by the following method. On the substrate 101, a resist is formed and patterning is made in a predetermined shape, followed by postbaking in which heat treatment at 110° C. for 30 minutes is performed, for example, in an oven, so that side faces of the resist become tapered. Subsequently, dry etching is performed under a predetermined condition for promoting the lateral etching, and the dry etching is paused before the resist is eliminated. Thereafter, the resist is peeled off and the dry etching is started again to perform etching at a predetermined amount. The convex parts 12 formed by this method have excellent in-plane uniformity of height.

Moreover, if wet etching is employed as the etching method, the convex parts 12 of surfaces 12c not parallel to the C-plane can be formed by combining with dry etching.

For example, if the substrate 101 is made of single crystal sapphire, wet etching can be performed, for example, by using an acid such as a mixed acid of phosphoric acid and sulfuric acid at a high temperature of 250° C. or higher.

As to the combination method of wet etching and dry etching, the convex parts 12 can be formed by, for example, a method for dry-etching the substrate 101 until elimination of the mask, followed by wet etching at a predetermined amount with use of a high temperature acid. By forming the convex parts 12 by such a method, crystal planes can be exposed on inclined planes constituting the side faces of the convex parts 12, and the inclined planes of the convex parts 12 can be angled with excellent reproducibility. In addition, a clear crystal plane can be exposed on the surface 11 with excellent reproducibility.

In addition, as to the combination method of wet etching and dry etching, besides the abovementioned method, the convex parts 12 can also be formed by a method for forming a mask from an acid-resistant material such as $SiO_2$, followed by wet etching, peeling-off of the mask, and dry etching under a predetermined condition for promoting the lateral etching. The convex parts 12 formed by this method have excellent in-plane uniformity of height. Moreover, by forming the convex parts 12 by this method, the inclined planes constituting the side faces of the convex parts 12 can also be angled with excellent reproducibility This embodiment has been described by exemplifying cases in which etching is employed for the formation of the convex parts; however, the present invention is not limited to the above methods. For example, the convex parts may also be formed by depositing a material serving as the convex parts on the substrate. As to the method of depositing a material serving as the convex parts on the substrate, there can be employed a sputtering method, an evaporation method, a CVD method, and the like. In addition, as to the material serving as the convex parts, it is preferable to use a material having an approximately equal refractive index to that of the substrate. $Al_2O_3$, SiN, $SiO_2$, and the like can be used for sapphire substrates.

(Shape of Substrate)

As shown in FIG. 2, a plurality of convex parts 12 are formed on the upper surface 10 of the substrate 101 on which the substrate processing step has been completed. In addition, as shown in FIG. 2, the portion of the upper surface 10 of the substrate 101 on which no convex parts 12 is formed, serves as the flat surface 11 of the (0001) C-plane. Accordingly, as shown in FIG. 1 and FIG. 2, the upper surface 10 of the substrate 101 is composed of the plurality of convex parts 12 and the flat surface 11 of the (0001) C-plane.

As shown in FIG. 1 and FIG. 2, the convex part 12 consists of a surface 12c not parallel to the C-plane, and the surface 12c has no (0001) C-plane. The convex parts 12 shown in FIG. 1 and FIG. 2 are such that: the planar shape of the base portion 12a is approximately circular; the external contour becomes upwardly gradually smaller; and the side face 12b has an outwardly curved bowl-shape (hemispherical shape). Moreover, as shown in FIG. 1 and FIG. 2, the planar arrangement of the convex parts 12 takes a grid formation of equal intervals.

In addition, the convex part 12 shown in FIG. 1 and FIG. 2 has a base portion width $d_1$ of 0.05 to 5 μm and a height h of 0.05 to 5 μm, the height h is not smaller than ¼ of the base portion width $d_1$, and an interval $d_2$ between adjacent convex parts 12 is 0.5 to 5 times the base portion width $d_1$. Here, the term "base portion width $d_1$ of the convex part 12" refers to a length of the maximum width of the bottom (base portion 12a) of the convex part 12. Moreover, the term "interval $d_2$ between adjacent convex parts 12" refers to a distance between edges of base portions 12a of the nearest convex parts 12.

The interval $d_2$ between adjacent convex parts 12 is preferably 0.5 to 5 times the base portion width $d_1$. If the interval $d_2$ between convex parts 12 is smaller than 0.5 times the base portion width $d_1$, then upon epitaxially growing the group III nitride semiconductor layer 103, crystal growth from the top of the flat surface 11 of the C-plane can be hardly promoted, which makes it difficult to completely embed the convex parts 12 in the group III nitride semiconductor layer 103, and thus the obtained flatness of the surface 103a of the group III nitride semiconductor layer 103 may become insufficient. Accordingly, when a crystal of a semiconductor layer serving as the LED structure is formed on the group III nitride semiconductor layer 103 in which the convex parts 12 are embedded, many pits are naturally formed in the crystal of the semiconductor layer constituting the LED structure, which leads to deterioration of the output, the electrical characteristic, and the like of the group III nitride semiconductor light-emitting device to be formed. In addition, if the interval $d_2$ between convex parts 12 exceeds 5 times the base portion width $d_1$, then upon formation of the group III nitride semiconductor light-emitting device with use of the substrate 101, diffuse reflection of light will less likely occur in the interface between the substrate 101 and the group III nitride semiconductor layer formed on the substrate 101, which may cause insufficient improvement of the light extraction efficiency.

The base portion width $d_1$ is preferably 0.05 to 5 μm. If the base portion width $d_1$ is smaller than 0.05 μm, then upon formation of the group III nitride semiconductor light-emitting device with use of the substrate 101, the obtained effect of diffusing reflection of light may become insufficient. In addition, if the base portion width $d_1$ exceeds 5 μm, it becomes difficult to epitaxially grow the group III nitride semiconductor layer 103 while embedding the convex parts 12 therein.

The height h of the convex part 12 is preferably 0.05 to 5 μm. If the height h of the convex part 12 is smaller than 0.05 μm, then upon formation of the group III nitride semiconductor light-emitting device with use of the substrate 101, the obtained effect of diffusing reflection of light may become insufficient. In addition, if the height h of the convex part 12 exceeds 5 μm, it becomes difficult to epitaxially grow the group III nitride semiconductor layer 103 while embedding the convex parts 12 therein, and the obtained flatness of the surface 103a of the group III nitride semiconductor layer 103 may become insufficient.

Moreover, the height h of the convex part 12 is preferably not smaller than ¼ of the base portion width $d_1$. If the height h of the convex part 12 is smaller than ¼ of the base portion width $d_1$, then upon formation of the group III nitride semiconductor light-emitting device with use of the substrate 101, the obtained effect of diffusing reflection of light and the obtained effect of improving the light extraction efficiency may become insufficient.

The shape of the convex part 12 is not limited to the example shown in FIG. 2, and any shape may be employed as long as it consists of a surface not parallel to the C-plane. For example, the shape may be such that: the planar shape of the base portion is approximately polygonal; the external contour becomes upwardly gradually smaller; and the side faces 12 are outwardly curved. Moreover, the shape may also be an approximately conical shape or an approximately polygonal pyramid shape in which the side face consists of inclined plane(s) and the external contour becomes upwardly gradually smaller. In addition, the shape may also be such that the inclination angle of the side face is changed stepwise at two levels.

Furthermore, the planar arrangement of the convex parts 12 is not limited to the example shown in FIG. 2, and the convex parts may be arranged either at equal intervals or unequal intervals. In addition, the planar arrangement of the convex parts 12 may be in a rectangular, triangular, or random form.

(Substrate Material)

As to the material usable for the abovementioned substrate 101 in the light-emitting device of this embodiment, any substrate material can be used by selecting from various materials without particular limitations as long as a group III nitride compound semiconductor crystal can epitaxially grow on the surface thereof. Examples of such a material include sapphire, SiC, silicon, zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, and molybdenum.

In particular, among these substrate materials, sapphire is preferably used. On the C-plane of the sapphire substrate is desirably formed an internal layer (buffer layer) 102.

Among the abovementioned substrate materials, some oxide substrates and metal substrates are known to cause chemical decomposition by being contacted with ammonia at a high temperature. It is effective to use such an oxide substrate or a metal substrate for the prevention against chemical decomposition of the substrate 101, if the internal layer 102 is formed without using ammonia, and if a ground layer 103 constituting an n-type semiconductor layer 104, which will be described later, is formed with ammonia, because the internal layer 102 acts as a coat layer.

In addition, the temperature of the substrate 101 can be kept low if the internal layer 102 is formed by a sputtering method. Hence, even if the substrate 101 made of a material decomposable at high temperatures is used, respective layers can be formed on the substrate without damaging the substrate 101.

(Buffer Layer Formation Step)

In this embodiment, after the substrate processing step and before the epitaxial step, the buffer layer 102 shown in FIG. 1 is laminated on the upper surface 10 of the substrate 101.

The buffer layer 102 is preferably made of polycrystal $Al_xGa_{1-x}N$ (0≦x≦1), and more preferably single crystal $Al_xGa_{1-x}N$ (0≦x≦1).

As described above, the buffer layer 102 can be made of, for example, polycrystal $Al_xGa_{1-x}N$ (0≦x≦1) in a thickness of 0.01 to 0.5 μm. If the thickness of the buffer layer 102 is smaller than 0.01 μm, the obtained effect of the buffer layer 102 to relax the difference in the lattice constant between the substrate 101 and the group III nitride semiconductor layer 103 may become insufficient. If the thickness of the buffer layer 102 exceeds 0.5 μm, although the function as the buffer layer 102 remains unchanged, it may take a longer time to form the buffer layer 102, which may lower the productivity.

The buffer layer 102 has a function to relax the difference in the lattice constant between the substrate 101 and the group III nitride semiconductor layer 103, and to facilitate the formation of a single crystal layer oriented along the C-axis on the (0001) C-plane of the substrate 101. Accordingly, by laminating the single crystal group III nitride semiconductor layer 103 on the buffer layer 102, much better crystallinity can be provided to the laminated group III nitride semiconductor layer 103. In the present invention, the buffer layer formation step is preferably performed, although it is not necessary to perform this.

The buffer layer 102 has a crystal structure of a hexagonal system made of a group III nitride semiconductor. The crystal of the group III nitride semiconductor constituting the buffer layer 102 preferably takes a single crystal structure. By controlling the growth condition, a crystal of a group III nitride semiconductor can grow not only upward but also towards the in-plane direction to thereby form a single crystal structure.

Accordingly, by controlling the film formation condition of the buffer layer 102, the buffer layer 102 can be made of a single crystal structure of a group III nitride semiconductor crystal. When the buffer layer 102 having such a single crystal structure is formed on the substrate 101, the buffering function of the buffer layer 102 can work effectively. Therefore, a group III nitride semiconductor film formed thereon serves as a crystal film having excellent orientation and crystallinity.

Moreover, the crystal of the group III nitride semiconductor constituting the buffer layer 102 may also be in the form of a columnar crystal (polycrystal) of an aggregate structure, which is basically a hexagonal column, by controlling the film formation condition. The term "columnar crystal of an aggregate structure" used herein refers to a crystal in which adjacent crystal grains are separated since crystal grain boundaries are formed therebetween, and the crystal per se is in a columnar shape in longitudinal cross-section.

When the buffer layer 102 is to be formed on the upper surface 10 of the substrate 101, the substrate 101 is desirably subjected to a pretreatment prior to the formation of the buffer layer 102.

Examples of the pretreatment can include a method in which the substrate 101 is placed in a chamber of a sputtering apparatus and sputtering is performed prior to the formation of the buffer layer 102. Specifically, a pretreatment for washing the upper surface 10 can be performed by exposing the substrate 101 to a plasma of Ar or $N_2$ in the chamber. By treating the upper surface 10 of the substrate 101 with a plasma of an Ar gas, an $N_2$ gas, or the like, organic materials and oxides adhered onto the upper surface 10 of the substrate 101 can be removed. In this case, if an electrical voltage is applied between the substrate 101 and the chamber without applying power to the target, plasma particles will act efficiently on the substrate 101.

In addition, the pretreatment on the substrate 101 is preferably performed by means of a plasma treatment in an atmosphere where an ion component such as $N^+$ and $(N_2)^+$ and an uncharged radical component such as N radical and $N_2$ radical are mixed.

Here, upon removal of contamination such as organic materials and oxides from the substrate surface, for example, if only an ion component or the like is supplied to the substrate surface, the energy is so strong that the substrate surface is damaged, which leads to a problem of deterioration of the quality of the crystal to be grown on the substrate.

In this embodiment, the pretreatment on the substrate 101 is performed by a method using a plasma treatment, as mentioned above, in an atmosphere where an ion component and a radical component are mixed, so that the substrate 101 is treated with reactive species having appropriate energy, by which contamination can be removed without damaging the surface of the substrate 101. The mechanism of how such an effect is obtained can be attributed to the reduction of damage on the surface of the substrate 101 by using a plasma having an ion component at a small proportion, and to the effective removal of contamination by treating the surface of the substrate 101 with a plasma.

After the pretreatment on the substrate 101, the buffer layer 102 is formed on the substrate 101 by a sputtering method. If the buffer layer 102 having a single crystal structure is formed by a sputtering method, the nitrogen raw material in the chamber and the ratio of the nitrogen flow to the inert gas flow are desirably set such that the nitrogen raw material accounts for 50% to 100%, and desirably 75%.

In addition, if the buffer layer 102 having a columnar crystal (polycrystal) is formed by a sputtering method, the nitrogen raw material in the chamber and the ratio of the nitrogen flow to the inert gas flow are desirably set such that the nitrogen raw material accounts for 1% to 50%, and desirably 25%.

The buffer layer 102 can be formed not only by the sputtering method as mentioned above, but also a MOCVD method. However, since the convex parts 12 are formed on the upper surface 10 of the substrate 101, the formation of the buffer layer by means of the MOCVD method may cause turbulence of the flow of the raw material gas on the upper surface 10. For this reason, it is difficult to uniformly laminate the buffer layer 102 by a MOCVD method on the upper surface 10 of the substrate 101. On the other hand, the sputtering method is excellent in the straightness of raw material particles, and thus is capable of laminating a uniform buffer layer 102 without an influence from the shape of the upper surface 10. Accordingly, the buffer layer 102 is preferably formed by the sputtering method.

(Epitaxial Step)

In this embodiment, after the buffer layer formation step, an epitaxial step of epitaxially growing the single crystal group III nitride semiconductor layer 103 on the upper surface 10 of the substrate 101 that has been formed with the buffer layer 102, to thereby embed the convex parts 12 in the group III nitride semiconductor layer 103, is performed.

As to the group III nitride semiconductor layer 103, $Al_xGa_yIn_zN$ ($0 \leq x \leq 1$, $0 \leq y \leq 1$, $0 \leq z \leq 1$, and $x+y+z=1$) can be used, although $Al_xGa_{1-x}N$ ($0 \leq x \leq 1$) is preferably employed since a group III nitride semiconductor 103 having excellent crystallinity can be formed.

The maximum thickness H of the group III nitride semiconductor layer 103 is preferably at least twice the height h of the convex part 12, since the group III nitride semiconductor layer 103 having a flat surface 103a can be obtained. If the maximum thickness H of the group III nitride semiconductor layer 103 is less than twice the height h of the convex part 12, the flatness of the surface 103a of the group III nitride semiconductor layer 103 grown by having the convex parts 12 embedded therein becomes insufficient, which may cause deterioration of the crystallinity of the crystal constituting the LED structure, if laminated on the group III nitride semiconductor layer 103.

In order to improve the crystallinity of the group III nitride semiconductor layer 103, the group III nitride semiconductor layer 103 is desirably not doped with any impurity. However, if p-type or n-type conductivity is needed, an acceptor impurity or a donor impurity may be doped.

For example, when a single crystal group III nitride semiconductor layer is to be epitaxially grown on the surface of a sapphire substrate, a single crystal oriented in the C-axis direction is apt to epitaxially grow from the C-plane, whereas from other surface than the C-plane is not apt to epitaxially grow any single crystal. In addition, when a single crystal group III nitride semiconductor layer is to be grown on the surface of a sapphire substrate with use of the MOCVD method, a single crystal layer epitaxially grows from the C-plane, whereas a surface other than the C-plane does not epitaxially grow any single crystal layer. Accordingly, the group III nitride semiconductor layer 103 is preferably grown by the MOCVD method. In this embodiment, when the single crystal group III nitride semiconductor layer 103 is to be epitaxially grown by the MOCVD method on the upper surface 10 of the substrate 101 formed with the buffer layer 102, no crystal is grown from the surface 12c of the convex part 12 of the surface 12c not parallel to the C-plane, while a crystal oriented in the C-axis is epitaxially grown exclusively from the flat surface 11 of the (0001) C-plane.

When the group III nitride semiconductor layer 103 is to be laminated by the MOCVD method, hydrogen ($H_2$) or nitrogen ($N_2$) can be employed as a carrier gas, trimethylgallium (TMG) or triethylgallium (TEG) can be employed as a Ga (Group III element) source, trimethylaluminum (TMA) or triethylaluminum (TEA) can be employed as an Al (Group III element) source, trimethylindium (TMI) or triethylindium (TEI) can be employed as an In (Group III element) source, and ammonia ($NH_3$), hydrazine ($N_2H_4$), or the like can be employed as an N (Group V element) source. In addition, as to the n-type dopant, monosilane ($SiH_4$) or disilane ($Si_2H_6$) can be employed as an Si source, and an organic germanium compound such as germane gas ($GeH_4$), tetramethylgermanium ($(CH_3)_4Ge$), or tetraethylgermanium ($(C_2H_5)_4Ge$) can be employed as a Ge source. As to the p-type dopant, cyclopentadienylnagnesium ($Cp_2Mg$) can be employed as an Mg source.

In addition, when the group III nitride semiconductor layer 103 is to be epitaxially grown by the MOCVD method on the upper surface 10, then on the substrate 101 formed with the convex parts 12, compared to a substrate without the formation of the convex parts 12, it is difficult to laminate a group III nitride semiconductor layer 103 having excellent flatness. Moreover, in the group III nitride semiconductor layer 103 laminated on the upper surface 10 of the substrate 101 formed with the convex parts 12, tilting of the C-axis direction and twisting of the C-axis which deteriorate the crystallinity are apt to occur.

For this reason, when the group III nitride semiconductor layer 103 is to be epitaxially grown by the MOCVD method on the upper surface 10 of the substrate 101 formed with the convex parts 12, the growth condition is desirably set as follows so as to obtain sufficient surface flatness and excellent crystallinity.

(Growth Condition)

When the group III nitride semiconductor layer 103 is to be epitaxially grown by the MOCVD method on the upper surface 10 of the substrate 101 formed with the convex parts 12, the growth pressure and the growth temperature are preferably set to the following condition. A lower growth pressure and a higher growth temperature promote the lateral growth of the crystal, while a higher growth pressure and a lower growth temperature lead to a facet growth mode (Δ shape).

Moreover, a higher growth pressure at the initial stage of the growth tends to lower the full width at half maximum of an X-ray rocking curve (XRC-FWHM) and improve the crystallinity.

Accordingly, when the group III nitride semiconductor layer 103 is to be epitaxially grown by the MOCVD method on the upper surface 10 of the substrate 101 formed with the convex parts 12, the growth pressure is preferably changed stepwise at two levels: during a time (first half) until the thickness of the group III nitride semiconductor layer 103 becomes about 2 μm or thicker; and at a time (latter half) after the group III nitride semiconductor layer 103 has been laminated in the thickness of about 2 μm or thicker.

In the first half, the growth pressure is preferably set at 40 kPa or higher, and more preferably about 60 kPa. If the growth pressure is set at 40 kPa or higher, a facet growth mode (Δ shape) is brought about and dislocations are laterally curved while avoiding penetration into the epitaxial surface. For this reason, a higher growth pressure can be assumed to lower dislocations and improve the crystallinity. On the other hand, a growth pressure at lower than 40 kPa is not preferred since the crystallinity is deteriorated and the full width at half maximum of the X-ray rocking curve (XRC-FWHM) is increased.

However, if the growth pressure is set at 40 kPa or higher, pits are easily generated in the surface of the epitaxially grown group III nitride semiconductor layer 103, and thus the obtained surface flatness may become insufficient. For this reason, if the growth pressure is set at 40 kPa or higher, the growth temperature is preferably set at 1140° C. or lower, and more preferably about 1120° C. A growth temperature at 1140° C. or lower can sufficiently prevent the generation of pits even if the growth pressure is set at 40 kPa or higher, and more preferably about 60 kPa.

In addition, in the latter half, the growth pressure is preferably set at 40 kPa or lower, and more preferably about 20 kPa. If the growth pressure is set at 40 kPa or lower in the latter half, the lateral growth of the crystal can be promoted, and a group III nitride semiconductor layer 103 with excellent surface flatness can be obtained.

From the above process, the laminated structure shown in FIG. 1 can be obtained.

The method for producing a group III nitride semiconductor layer of this embodiment comprises: the substrate processing step of forming the upper surface 10 that is composed of the flat surface 11 of the C-plane and the plurality of convex parts 12 of the surfaces 12c not parallel to the C-plane; and an epitaxial step of growing the group III nitride semiconductor layer 103 for embedding the convex parts 12 therein, on the upper surface 10. Therefore, crystal defects such as dislocation hardly occur in the crystal of the group III nitride semiconductor layer 103, and a group III nitride semiconductor layer 103 with excellent crystallinity can be formed.

Here, for example, if the C-plane is present on the surface of the convex part, then upon epitaxial growth of a single crystal group III nitride semiconductor layer on the substrate formed with such convex parts, crystals are grown from both the C-plane present on the surface of the convex part, and the C-plane in the area without the formation of the convex parts. In this case, crystal defects such as dislocation are apt to occur in a portion where a crystal grown from the surface of the convex part and a crystal grown from the area without the formation of the convex parts, are integrated, and a group III nitride semiconductor layer with excellent crystallinity can be hardly obtained. The crystal defects occurring herein may be transferred into the crystal of the semiconductor layers constituting the LED structure, if the LED structure is formed from an n-type layer, a light-emitting layer, and a p-type layer on the group III nitride semiconductor layer, and may cause a lower internal quantum efficiency and an increased leakage current of the light-emitting device, when formed.

However, in this embodiment, the convex parts 12 of the surfaces 12c not parallel to the C-plane are formed on the substrate 101 to thereby form the upper surface 10 composed of the flat surface 11 and the convex parts 12. Therefore, if the group III nitride semiconductor layer 103 is to be epitaxially grown on the upper surface 10 of the substrate 101, the crystal is grown exclusively from the flat surface 11. Accordingly, the group III nitride semiconductor layer 103 formed on the upper surface 10 of the substrate 101 is epitaxially grown on the upper surface 10 while embedding the convex parts 12 therein, and will not cause crystal defects in the crystal.

Therefore, if an LED structure is formed from an n-type layer, a light-emitting layer, and a p-type layer, each of which is made of a group III nitride semiconductor, on the group III nitride semiconductor layer 103 obtained from the production method of this embodiment, the crystallinity of the crystal constituting the LED structure becomes excellent, and if a light-emitting device is formed thereon, the internal quantum efficiency becomes excellent and the leakage is decreased. Furthermore, in this embodiment, since the convex parts 12 are formed on the substrate 101, the interface between the substrate 101 and the group III nitride semiconductor layer is made concavo-convex, and the laminated structure shown in FIG. 1 can achieve a light-emitting device having excellent light extraction efficiency because of the diffuse reflection of light in the interface.

[Group III Nitride Semiconductor Light-Emitting Device]

Figure 3:
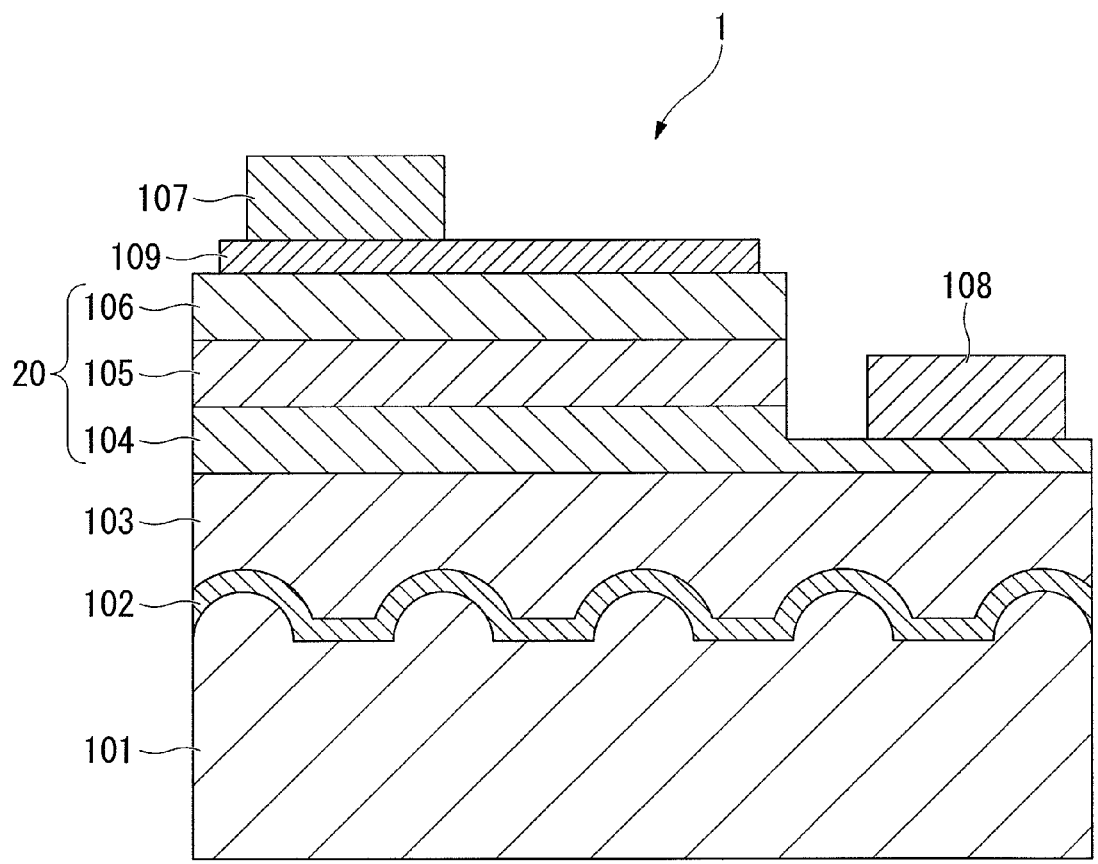
FIG. 3 is a cross-sectional view showing an example of a group III nitride semiconductor light-emitting device of the present invention.
Figure 4:
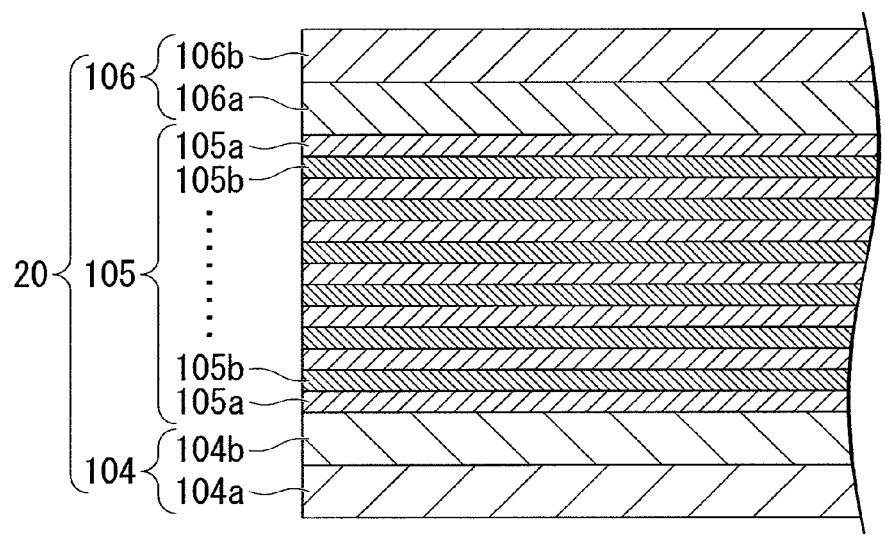
FIG. 4 is a cross-sectional view showing an example of the group III nitride semiconductor light-emitting device of the present invention, being a partially enlarged cross-sectional view of the group III nitride semiconductor light-emitting device of FIG. 3.

FIG. 3 is a cross-sectional view showing an example of a group III nitride semiconductor light-emitting device of the present invention. The group III nitride semiconductor light-emitting device 1 shown in FIG. 3 (hereunder, may be abbreviated as the light-emitting device) comprises the LED structure 20 formed on the group III nitride semiconductor layer 103 of the laminated structure shown in FIG. 1. In addition, in FIG. 3, reference symbol 107 denotes a positive electrode bonding pad and reference symbol 108 denotes a negative electrode bonding pad. Moreover, FIG. 4 is a partially enlarged cross-sectional view showing the n-type layer 104, the light-emitting layer 105, and the p-type layer 106 in the light-emitting device 1 of FIG. 3.

As the example shown in FIG. 3, the group III nitride semiconductor light-emitting device 1 of this embodiment is a monoplanar electrode type, comprising the internal layer 102 and the LED structure (group III nitride semiconductor layer) 20 made of a group III nitride semiconductor containing Ga as a group III element, which are formed on the substrate 101 as mentioned above. As shown in FIG. 3, the LED structure 20 comprises the n-type semiconductor layer 104, the light-emitting layer 105, and the p-type semiconductor layer 106, which are respectively laminated in this order.

(Led Structure)

The LED structure 20 comprises the n-type layer 104, the light-emitting layer 105, and the p-type layer 106, each of which is made of a group III nitride semiconductor. An LED structure 20 with excellent crystallinity can be obtained if formed by the MOCVD method.

The n-type layer 104 is usually composed of an n-contact layer 104a and an n-clad layer 104b. The n-contact layer 104a may also function as the n-clad layer 104b.

The n-contact layer 104a is a layer for providing a negative electrode. The n-contact layer 104a is preferably composed of an $Al_xGa_{1-x}N$ layer ($0 \leq x \leq 1$, more preferably $0 \leq x \leq 0.5$, and even more preferably $0 \leq x \leq 0.1$). In addition, the n-contact layer 104a is preferably doped with an n-type impurity. The concentration of the n-type impurity is preferably $1 \times 10^{17}$ to $1 \times 10^{20}/cm^3$, and preferably $1 \times 10^{18}$ to $1 \times 10^{19}/cm^3$, in terms of maintenance of excellent ohmic contact with the negative electrode. The type of n-type impurity is not particularly limited. Examples thereof can include Si, Ge, and Sn, and preferably Si and Ge.

The thickness of the n-contact layer 104a is preferably 0.5 to 5 μm, and more preferably within a range of 1 to 3 μm. If the thickness of the n-contact layer 104a is within the above range, the crystallinity of the semiconductor can be kept excellent.

The n-clad layer 104b is preferably provided between the n-contact layer 104a and the light-emitting layer 105. The n-clad layer 104b is a layer which performs carrier injection into and carrier confinement within the light-emitting layer 105. The n-clad layer 104b can be formed of AlGaN, GaN, GaInN, or the like. In addition, the n-clad layer 104b may also take a superlattice structure having a heterojunction, or multiple laminations, of these structures. In the case where the n-clad layer 104b is formed of GaInN, it is needless to say that the band gap of the n-clad layer 104b is desirably greater than that of the GaInN of the light-emitting layer 105.

The thickness of the n-clad layer 104b is not particularly limited, although it is preferably 0.005 to 0.5 μm, and more preferably 0.005 to 0.1 μm. The concentration of the n-type dopant in the n-clad layer 104b is preferably $1 \times 10^{17}$ to $1 \times 10^{20}/cm^3$, and more preferably $1 \times 10^{18}$ to $1 \times 10^{19}/cm^3$. The dopant concentration is preferably within this range in terms of maintenance of excellent crystallinity and reduction of the operating voltage of the device.

If the n-clad layer 104b is made to include a superlattice structure, while details are not shown, the structure may be such that: an n-side first layer made of a group III nitride semiconductor in a thickness of 100 angstroms or thinner, and an n-side second layer made of a group III nitride semiconductor having a different composition from that of the n-side first layer in a thickness of 100 angstroms or thinner, are laminated. Moreover, the n-clad layer 104b may also include a structure such that: the n-side first layers and the n-side second layers are alternately laminated. Furthermore, preferably, either one of the n-side first layer or the n-side second layer is in contact with an active layer (light-emitting layer 15) in the structure.

The n-side first layer and the n-side second layer as mentioned above may have, for example, an Al-containing AlGaN-based composition (which may be simply referred to as AlGaN), an In-containing GaInN-based composition (which may be simply referred to as GaInN), or a GaN composition. In addition, the n-side first layer and the n-side second layer may take an alternate structure of GaInN/GaN, an alternate structure of AlGaN/GaN, an alternate structure of GaInN/AlGaN, an alternate structure of GaInN/GaInN having different compositions (the term "different composition" in the present invention refers to a difference in the abundance ratio of respective elements, which will be hereinunder used in the same meaning), and an alternate structure of AlGaN/AlGaN having different compositions. In the present invention, the n-side first layer and the n-side second layer preferably take an alternate structure of GaInN/GaN or GaInN/GaInN having different compositions.

In the abovementioned superlattice layer, the thicknesses of the n-side first layer and the n-side second layer are preferably, respectively, 60 angstroms or thinner, more preferably 40 angstroms or thinner, and most preferably within a range of 10 angstroms to 40 angstroms. It is not preferable that the thicknesses of the n-side first layer and the n-side second layer forming the superlattice layer exceed 100 angstroms, since crystal defects will be easily contained therein.

The abovementioned n-side first layer and n-side second layer may take respectively doped-structures, or may take a combination of doped-structure/undoped-structure. As to the impurity to be doped, any conventionally known impurity for the abovementioned material compositions may be used without limitation. For example, when an alternate structure of GaInN/GaN or GaInN/GaInN having different compositions is used as the n-clad layer, Si is suitable as the impurity. In addition, the n-side superlattice multilayered film as mentioned above may also be formed by appropriately changing the ON/OFF state of doping, even if the same composition such as GaInN, AlGaN, and GaN is used.

As to the light-emitting layer 105 laminated on the n-type layer 104, there can be enumerated a light-emitting layer 105 having a single quantum well structure, a multiquantum well structure, or the like. As to the well layer 105b having a quantum well structure as shown in FIG. 4, a group III nitride semiconductor layer made of $Ga_{1-y}In_yN$ ($0<y<0.4$) is usually used. The thickness of the well layer 105b can be set to a degree that can achieve the quantum effect, for example 1 to 10 nm, and preferably 2 to 6 nm, in terms of light emission output.

In addition, if the light-emitting layer 105 takes a multi-quantum well structure, the abovementioned $Ga_{1-y}In_yN$ is used for the well layer 105b, and $Al_zGa_{1-z}N$ ($0 \leqq z < 0.3$) whose band gap energy is greater than that of the well layer 105b is used for the barrier layer 105a. The well layer 105b and the barrier layer 105a may be or may not be doped with an impurity, according to the design.

The p-type layer 106 is usually composed of a p-clad layer 106a and a p-contact layer 106b. In addition, the p-contact layer 106b may also function as the p-clad layer 106a.

The p-clad layer 106a is a layer which performs carrier confinement within and carrier injection into the light-emitting layer 105. The p-clad layer 106a is not particularly limited as long as it has a composition which can achieve a greater band gap energy than that of the light-emitting layer 105, and carrier confinement within the light-emitting layer 105 can be performed, although $Al_xGa_{1-x}N$ ($0 < x \leqq 0.4$) is preferred. The p-clad layer 106a is preferably composed of such AlGaN in terms of the carrier confinement within the light-emitting layer. The thickness of the p-clad layer 106a is not particularly limited, although it is preferably 1 to 400 nm, and more preferably 5 to 100 nm. The p-type dopant concentration of the p-clad layer 106a is preferably within a range of $1 \times 10^{18}$ to $1 \times 10^{21}/cm^3$, and more preferably $1 \times 10^{19}$ to $1 \times 10^{20}/cm^3$. If the p-type dopant concentration is within the above range, an excellent p-type crystal can be obtained without lowering the crystallinity.

In addition, the p-clad layer 106a may also take a superlattice structure in which a plurality of layers are laminated.

If the p-clad layer 106a is made to include a superlattice structure, while details are not shown, the structure may be such that: a p-side first layer made of a group III nitride semiconductor in a thickness of 100 angstroms or thinner, and a p-side second layer made of a group III nitride semiconductor having a different composition from that of the p-side first layer in a thickness of 100 angstroms or thinner, are laminated. Moreover, the p-clad layer 106a may also include a structure such that: the p-side first layers and the p-side second layers are alternately laminated.

The p-side first layer and the p-side second layer as mentioned above may have respectively different compositions, for example, those selected from AlGaN, GaInN, and GaN. In addition, the p-side first layer and the p-side second layer may take an alternate structure of GaInN/GaN, an alternate structure of AlGaN/GaN, or an alternate structure of GaInN/AlGaN. In the present invention, the p-side first layer and the p-side second layer preferably take an alternate structure of AlGaN/AlGaN or AlGaN/GaN.

In the abovementioned superlattice layer, the thicknesses of the p-side first layer and the p-side second layer are preferably, respectively, 60 angstroms or thinner, more preferably 40 angstroms or thinner, and most preferably within a range of 10 angstroms to 40 angstroms. It is not preferable that the thicknesses of the p-side first layer and the p-side second layer forming the superlattice layer exceed 100 angstroms, since crystal defects will be contained a lot in the layer.

The abovementioned p-side first layer and p-side second layer may take respectively doped-structures, or may take a combination of doped-structure/undoped-structure. As to the impurity to be doped, any conventionally known impurity for the abovementioned material compositions may be used without limitation. For example, when an alternate structure of AlGaN/GaN or an alternate structure of AlGaN/AlGaN having different compositions is used as the p-clad layer, Mg is suitable as the impurity. In addition, the p-side superlattice multilayered film as mentioned above may also be formed by appropriately changing the ON/OFF state of doping, even if the same composition such as GaInN, AlGaN, and GaN is used.

The p-contact layer 106b is a layer for providing a positive electrode. The p-contact layer 106b is preferably made of $Al_xGa_{1-x}N$ ($0 \leqq x \leqq 0.4$). The Al composition is preferably within the above range in terms of maintenance of excellent crystallinity and excellent ohmic contact with the p-ohmic electrode. A p-type impurity (dopant) is preferably contained at a concentration of $1 \times 10^{18}$ to $1 \times 10^{21}/cm^3$, and more preferably $5 \times 10^{19}$ to $5 \times 10^{20}/cm^3$, in terms of maintenance of excellent ohmic contact, prevention against cracking, and maintenance of excellent crystallinity. The type of p-type impurity is not particularly limited, although Mg is preferred. The thickness of the p-contact layer 106b is not particularly limited, although it is preferably 0.01 to 0.5 μm, and more preferably 0.05 to 0.2 μm. The thickness of the p-contact layer 106b is preferably within this range in terms of light emission output.

(Electrode)

The positive electrode bonding pad 107 is provided on a portion of a transparent positive electrode 109 composed of a transparent conductive oxide film layer which is in contact with the p-type layer 106.

The transparent positive electrode 109 can be provided with use of a material containing at least one selected from ITO ($In_2O_3$—$SnO_2$), AZO (ZnO—$Al_2O_3$), IZO ($In_2O_3$—ZnO), and GZO (ZnO—$Ga_2O_3$) by a commonly used means which is well known in this technological field. In addition, the structure of the transparent positive electrode 109 may be any structure including conventionally well known structures without any limitation. Moreover, the transparent positive electrode 109 may be either formed to cover substantially all over the surface of the p-type layer 106, or formed in a lattice-like shape or branching shape by leaving spaces. Furthermore, after the formation of the transparent positive electrode 109, thermal annealing for the purpose of alloying or transparent finishing may be either applied or not applied.

The positive electrode bonding pad 107 is provided for electrical connection with a circuit substrate, a lead frame, or the like. As to the positive electrode bonding pad, various structures using Au, Al, Ni, Cu, and the like are well known. These well known materials and structures may be employed without any limitation.

The thickness of the positive electrode bonding pad 107 is preferably within a range of 100 to 1000 nm. Moreover, in terms of the characteristic of the bonding pad, the thickness is preferably larger since the bondability becomes higher. Therefore, the thickness of the positive electrode bonding pad 107 is more preferably 300 nm or thicker. More preferably, the thickness of the positive electrode bonding pad 107 is not larger than 500 nm in terms of production cost.

The negative electrode bonding pad 108 is formed to be in contact with the n-type layer 104 of the LED structure 20. Therefore, upon formation of the negative electrode bonding pad 108, the light-emitting layer 105 and the p-type layer 106 are partially removed to thereby expose the n-contact layer of the n-type layer 104, and the negative electrode bonding pad 108 is formed thereon.

As to the negative electrode bonding pad 108, various compositions and structures are well known. These well known compositions and structures may be employed without any limitation, and can be provided by a commonly used means which is well known in this technical field.

The group III nitride semiconductor light-emitting device 1 shown in FIG. 3 comprises the LED structure 20 formed on the group III nitride semiconductor layer 103 that has been produced by the production method of the present invention. Therefore, the interface between the substrate 101 and the group III nitride semiconductor layer is made concavo-convex, and excellent light extraction efficiency can be achieved because of the diffuse reflection of light in the interface. Furthermore, as described above, in the group III nitride semiconductor light-emitting device 1 shown in FIG. 3, the crystallinity of the n-type layer 104, the light-emitting layer 105, and the p-type layer 106 made of group III nitride semiconductors that constitute the LED structure 20 becomes excellent. Therefore, lowering of the internal quantum efficiency can be prevented and the leakage current can be reduced, so that high output and excellent electrical characteristics can be achieved.

(Lamp)

The lamp of the present invention comprises the group III nitride semiconductor light-emitting device of the present invention.

Examples of the lamp of the present invention can include those having a combination of the group III nitride semiconductor light-emitting device of the present invention and a fluorescent substance. Such a lamp having a combination of the group III nitride semiconductor light-emitting device and a fluorescent substance may take a structure well known to those skilled in the art using means well known to those skilled in the art. In addition, hitherto, techniques for changing emission colors by combining a group III nitride semiconductor light-emitting device with fluorescent substances have been known, and such techniques can be employed for the lamp of the present invention without any limitation.

Figure 5:
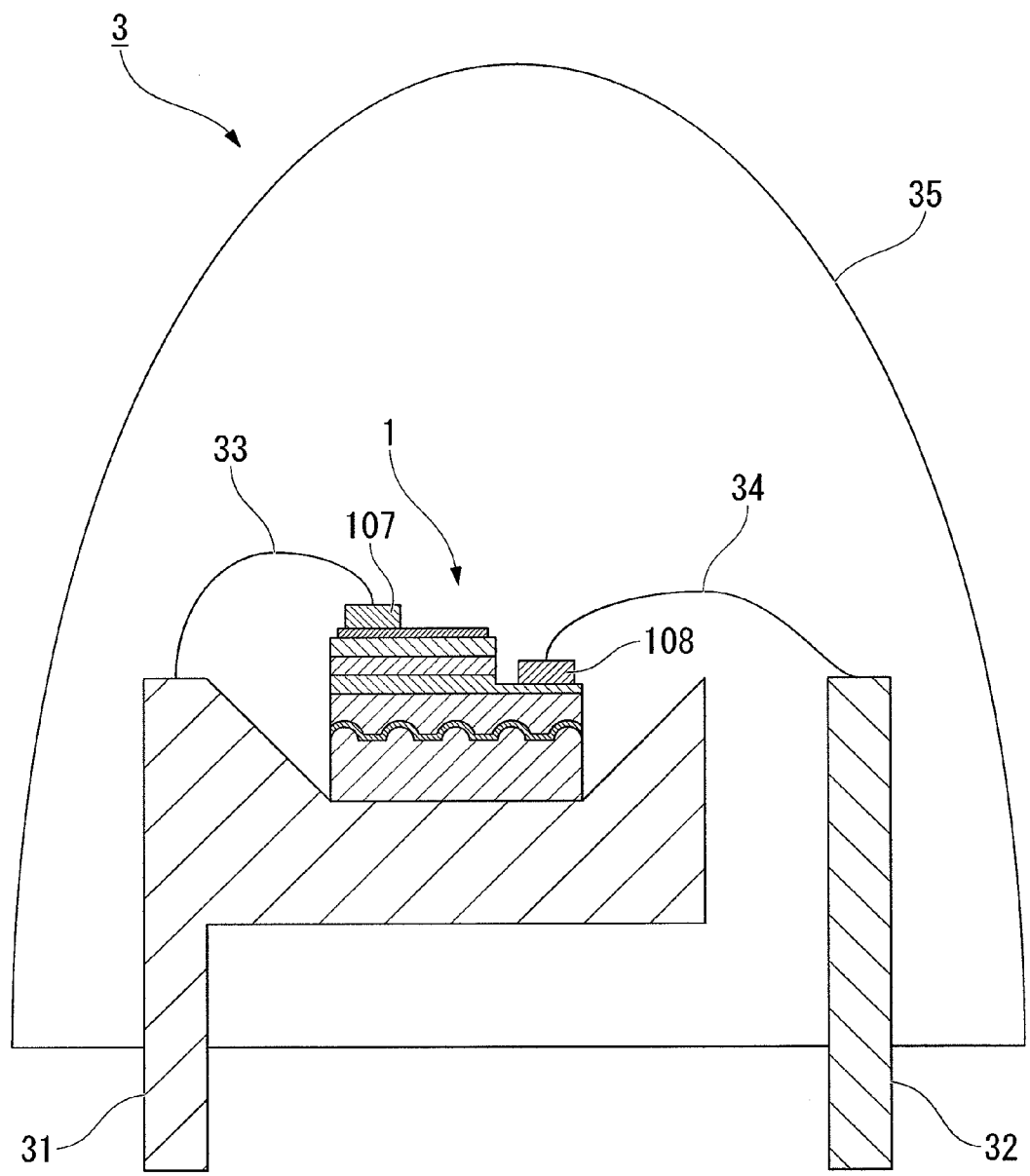
FIG. 5 is a schematic diagram showing an example of a lamp comprising the group III nitride semiconductor light-emitting device according to the present invention.

FIG. 5 is a schematic diagram showing an example of a lamp comprising the group III nitride semiconductor light-emitting device according to the present invention. The lamp 3 shown in FIG. 5 is a projectile type comprising the group III nitride semiconductor light-emitting device 1 shown in FIG. 3. As shown in FIG. 5, the positive electrode bonding pad 107 of the group III nitride semiconductor light-emitting device 1 is bonded to either one of two frames 31 or 32 (frame 31 in FIG. 5) through a wire 33, and the negative electrode bonding pad 108 of the light-emitting device 1 is connected to the other frame 32 through a wire 34, thereby mounting the group III nitride semiconductor light-emitting device 1. In addition, the surroundings of the group III nitride semiconductor light-emitting device 1 are sealed in a mold 35 made of a transparent resin.

The lamp of the present invention comprises the group III nitride semiconductor light-emitting device 1 of the present invention, and thus has excellent light emission characteristics.

The lamp of the present invention may be used for any application, such as a projectile type for general use, a side view type for use in a portable back light, and a top view type for use in an indicator.

EXAMPLES

Next is a more detailed description of the present invention, with reference to Examples and Comparative Examples. However, it should be noted that the present invention is not to be limited to these Examples.

Example 1

On the (0001) C-plane of a sapphire substrate, a plurality of convex parts having the "base portion width", "height", "base portion width/4", "interval between adjacent convex parts", and "presence/absence of C-plane on the surface of convex part" shown in Table 1 were formed as follows (substrate processing step). That is, on a C-plane sapphire substrate of a diameter of two inches was formed a mask by a publicly known photolithographic method, and the sapphire substrate was etched by a dry etching method to thereby form convex parts. For the exposure method, a stepper exposure method using ultraviolet radiation was employed. In addition, a mixed gas of $BCl_3$ and $Cl_2$ was used for dry etching.

TABLE 1

| | Base portion width (μm) | Height (μm) | Base portion width/4 (μm) | Interval between adjacent convex parts (μm) | Presence/absence of C-plane on the surface of convex part | Flatness | XRC-FWHM (0002) plane | XRC-FWHM (10-10) plane |
|---|---|---|---|---|---|---|---|---|
| Example 1 | 2.2 | 1.0 | 0.6 | 1.8 | Absent | ○ | 69 | 182 |
| Example 5 | 2.2 | 1.0 | 0.6 | 1.8 | Absent | ○ | 108 | 205 |
| Comparative Example 1 | 3.0 | 1.0 | 0.8 | 1.0 | Present | Δ | 156 | 220 |
| Comparative Example 2 | 2.2 | 1.0 | 0.6 | 0.8 | Absent | Δ | 95 | 193 |
| Comparative Example 3 | 2.2 | 1.0 | 0.6 | 1.8 | Present | ○ | 177 | 206 |

The thus obtained convex parts of Example 1 were such that: the planar shape of the base portion was approximately circular; the external contour became upwardly gradually smaller; and the side face had an outwardly curved bowl-shape (hemispherical shape).

Comparative Example 1 and Comparative Example 2

The convex parts of Comparative Example 1 and Comparative Example 2 were formed in the same manner as for Example 1, except that different masks were respectively used for exposure.

The thus obtained convex parts of Comparative Example 1 were such that: the planar shape of the base portion was circular; and the cross-sectional shape was trapezoid. In addition, in Comparative Example 2, the shape of the convex part was the same as for Example 1, whereas the "interval between adjacent convex parts" was different from that of the Example 1.

Comparative Example 3

The convex parts of Comparative Example 3 were formed in the same manner as for Example 1, except that etching was performed by a wet etching method. The thus obtained convex parts of Comparative Example 3 were such that: the planar shape of the base portion was circular; and the cross-sectional shape was trapezoid.

Thereafter, as will be described later, on the upper surfaces of the substrates that had been formed with the pluralities of convex parts of Example 1, and Comparative Example 1 to Comparative Example 3, a buffer layer having a single crystal structure of AlN was formed in a thickness of 50 nm using an RF sputtering method (buffer layer formation step).

For the sputtering deposition apparatus, there was employed an apparatus having a high frequency power supply and a mechanism capable of moving a position of a magnet within a target. First, the substrate formed with the plurality of convex parts was placed in a chamber of the sputtering deposition apparatus and was heated to 500° C. Only nitrogen gas was introduced into the chamber at a flow rate of 15 sccm. Then, while the pressure in the chamber was kept at 1 Pa, a high frequency bias of 500 W was applied to the substrate side to thereby expose the substrate to a nitrogen plasma, by which the substrate surface was washed (pretreatment).

Subsequently, argon gas and nitrogen gas were introduced into the chamber. Then under conditions where the substrate temperature was kept at 500° C., and a high frequency bias of 2000 W was applied to the metal Al target side, the pressure in the chamber was kept at 0.5 Pa, and the Ar gas was circulated at a flow rate of 5 sccm and the nitrogen gas was circulated at a flow rate of 15 sccm (nitrogen ratio to the total gas was 75%), an AlN buffer layer was formed on the substrate formed with the plurality of convex parts. The growth rate was 0.08 nm/s. The magnet in the target was shaken at both timings of the substrate washing and the buffer layer formation. Then, the film formation was performed for a duration that had been determined in accordance with the previously measured film growth rate. On completion of the deposition of the AlN buffer layer in a thickness of 50 nm on the substrate formed with the plurality of convex parts, the plasma operation was stopped, and the substrate temperature was lowered.

On the thus obtained buffer layer, a group III nitride semiconductor layer was epitaxially grown with use of the reduced pressure MOCVD method that will be described later (epitaxial step).

First, the substrate formed with up to the buffer layer was taken out from the sputtering deposition apparatus, placed in a reaction furnace for the growth of the group III nitride semiconductor layer by the MOCVD method, and mounted on a susceptor made of high purity graphite for semiconductors to be heated at a film deposition temperature by a high frequency (RF) induction heating system. Then, nitrogen gas was circulated in the vapor phase growth reaction furnace made of stainless steel, and the interior of the reaction furnace was purged.

Then, on completion of circulation of the nitrogen gas through the interior of the vapor phase growth reaction furnace for 8 minutes, the induction heating system was activated to raise the temperature of the sapphire substrate from room temperature to 500° C. for about 10 minutes. Then, while the substrate temperature was kept at 500° C., NH$_3$ gas and nitrogen gas were circulated. The pressure in the vapor phase growth reaction furnace was set at 95 kPa. Subsequently, the substrate temperature was raised to 1000° C. for about 10 minutes. The substrate was then allowed to stand at these temperature and pressure for 10 minutes to effect thermal cleaning of the substrate surface. After completion of the thermal cleaning, the supply of nitrogen gas into the vapor phase growth reaction furnace was kept continued.

Then, while the circulation of ammonia was kept continued, the substrate temperature was raised to 1120° C. in the hydrogen atmosphere. The pressure in the reaction furnace was set at 60 kPa. Upon confirmation of a stable substrate temperature at 1120° C., a supply of trimethylgallium (TMG) into the vapor phase growth reaction furnace was initiated to epitaxially grow an undoped GaN layer in a thickness of 3 μm on the AlN buffer layer. At that time, the amount of ammonia was adjusted so that the ratio of group V (N)/group III (Ga) became 600. Then, on completion of the growth of the group III nitride semiconductor layer composed of a GaN layer in a thickness of 3 μm, the supply of the raw material into the reaction furnace was stopped, and the substrate temperature was lowered.

Then, the substrate formed with the GaN layer was taken out from the reaction furnace, and the surface flatness of the GaN layer was observed. In addition, the full width at half maximum of the X-ray rocking curve (XRC-FWHM) of the GaN layer was measured. The results of the flatness and the full width at half maximum of the XRC (XRC-FWHM) of the GaN layer are shown in Table 1.

As shown in Table 1, in Comparative Example 1, since the C-plane was present on the surfaces of the convex parts, the crystallinity was inferior (XRC-FWHM values were 150 arcsec or more for the (0002) plane, and 200 arcsec or more for the (10-10) plane) as compared to Example 1. In addition, in Comparative Example 1, since the "interval between adjacent convex parts" was smaller than 0.5 times the base portion width, the surface flatness was also inferior (A) as compared to Example 1.

Moreover, in Comparative Example 2, since no C-plane was present on the surfaces of the convex parts as with Example 1, the crystallinity was not bad (XRC-FWHM values were 100 arcsec or less for the (0002) plane, and 200 arcsec or less for the (10-10) plane) although it was not better than that of Example 1. However, in Comparative Example 2, since the "interval between adjacent convex parts" was smaller than 0.5 times the base portion width, the surface flatness was inferior (A) as compared to Example 1.

Moreover, in Comparative Example 3, since the "interval between adjacent convex parts" was not smaller than 0.5 times the base portion width, the surface flatness was excellent (O). However, in Comparative Example 3, since the C-plane was present on the surfaces of the convex parts, the crystallinity was inferior (XRC-FWHM values were 150 arcsec or more for the (0002) plane, and 200 arcsec or more for the (10-10) plane) as compared to Example 1.

On the other hand, in Example 1, since the "interval between adjacent convex parts" was not smaller than 0.5 times the base portion width, the surface flatness was excellent (O). In addition, in Example 1, since no C-plane was present on the surfaces of the convex parts, the crystallinity was excellent (XRC-FWHM values were 100 arcsec or less for the (0002) plane, and 200 arcsec or less for the (10-10) plane).

Example 2 and Comparative Example 4

On the group III nitride semiconductor layer that had been formed by the same method as for Example 1 and Comparative Example 3, respective layers serving as the n-type layer, the light-emitting layer, and the p-type layer of the LED structure were laminated by the following methods.

(N-Type Layer)

An n-contact layer and an n-clad layer were formed as the n-type layer. First, the group III nitride semiconductor layer was formed by the same method as for Example 1 and Comparative Example 3. Then, the amount of ammonia was adjusted so that the ratio of group V (N)/group III (Ga) became 450. On the group III nitride semiconductor layer, an undoped GaN layer was grown in a thickness of 1 μm, and subsequently under the same condition, an n-contact layer composed of an n-type GaN layer was formed in a thickness of 2 μm using a monosilane ($SiH_4$) gas serving as a dopant gas.

The Si dopant amount was set at $5 \times 10^{18}/cm^3$. On completion of the growth of the n-contact layer, the valve for the TMG was closed to stop the supply of TMG into the reaction furnace.

After the growth of the n-contact layer, while the circulation of ammonia was kept as it was, the carrier gas was switched from all hydrogen gas into all nitrogen. Next, the substrate temperature was lowered from 1100° C. to 760° C. While the temperature inside the reaction furnace was being changed, the $SiH_4$ supply amount was set. The $SiH_4$ amount to be circulated through the interior of the reaction furnace was examined in advance, and was adjusted so that the electron concentration of the Si-doped GaInN clad layer became $1 \times 10^{18}$ $cm^{-3}$. The supply of ammonia into the furnace was kept continued at the unchanged flow rate.

Then, time was allowed until the state in the reaction furnace became stable, after which the valves for the TMI, TEG, and $SiH_4$ were simultaneously switched to initiate the supply of these raw materials into the reaction furnace. The supply thereof into the reaction furnace was kept continued for a predetermined time to thereby form an n-clad layer made of Si-doped $Ga_{0.99}In_{0.01}N$ in a thickness of 20 nm. Then, the valves for the TMI, TEG, and $SiH_4$ were switched to stop the supply of these raw materials.

(Light-Emitting Layer)

Next, a multiquantum well structure composed of barrier layers and well layers was formed as the light-emitting layer. First, after the formation of the n-clad layer, the $SiH_4$ supply amount into the reaction furnace was changed. The $SiH_4$ amount to be circulated through the interior of the reaction furnace was examined in advance, and was adjusted so that the electron concentration of the barrier layer composed of an Si-doped GaN layer became $3 \times 10^{17}$ $cm^{-3}$. Them, the substrate temperature was set at 750° C., and the supply of TEG and $SiH_4$ into the reaction furnace was initiated to thereby form a thin barrier layer A composed of an Si-doped GaN layer for a predetermined time. Then, the supply of TEG and $SiH_4$ was stopped.

Thereafter, the susceptor temperature was raised to 920° C. while the growth was being suspended. After the temperature had become stable, and while the substrate temperature, the pressure in the reaction furnace, and the flow rates and types of the ammonia gas and the carrier gas were kept as they were, the valves for the TEG and $SiH_4$ were switched again to initiate the supply of TEG and $SiH_4$ into the reaction furnace to thereby grow a barrier layer B composed of an Si-doped GaN layer at a substrate temperature of 930° C. for a predetermined time. On completion of the growth of the barrier layer B, the supply of TEG and $SiH_4$ into the reaction furnace was stopped.

Subsequently, the susceptor temperature was lowered to 750° C., and the supply of TEG and $SiH_4$ into the reaction furnace was initiated to thereby form a barrier layer C composed of an Si-doped GaN layer. Then, the valves were again switched to stop the supply of TEG and $SiH_4$ into the reaction furnace so as to complete the growth of the barrier layer C. By so doing, an Si-doped GaN barrier layer of three-layered structure comprising the barrier layer A, the barrier layer B, and the barrier layer C was formed in a total thickness of 20 nm.

On completion of the growth of this barrier layer, the supply of TEG and $SiH_4$ was stopped over a period of 30 seconds. The setting of the TEG supply amount was changed to a flow rate that had been examined in advance. Thereafter, while the substrate temperature, the pressure in the reaction furnace, and the flow rates and types of the ammonia gas and the carrier gas were kept as they were, the valves for the TEG and TMI were switched to supply TEG and TMI into the reaction furnace to thereby form a well layer. After the TEG and TMI had been supplied for a predetermined time, the valves were again switched to stop the supply of TEG and TMI so as to complete the growth of a well layer made of $Ga_{0.093}In_{0.07}N$. By so doing, a $Ga_{0.93}In_{0.07}N$ layer in a thickness of 3 nm was formed as a well layer. On completion of the growth of the well layer, the setting of the TEG supply amount was changed. Subsequently, the supply of TEG and $SiH_4$ was again initiated to start forming the second barrier layer.

Through five times repetition of this procedure, five barrier layers composed of Si-doped GaN layers and five well layers composed of $Ga_{0.93}In_{0.07}N$ were formed. In the production process of these well layers and barrier layers, after the formation of the barrier layer A at 750° C., during the step of raising the temperature to 920° C. for forming the barrier layer B, the growth of the semiconductor layer was suspended by stopping the supply of the group III raw materials.

Then, subsequently after the formation of the fifth well layer, the sixth barrier layer was formed.

In the formation of the sixth barrier layer, the supply of $SiH_4$ into the reaction furnace was again initiated to form a thin barrier layer A composed of Si-doped GaN, and then, the substrate temperature was raised to 930° C. while the supply of TEG and $SiH_4$ into the reaction furnace was kept continued to thereby directly grow a barrier layer B at the substrate temperature of 920° C. for a predetermined time. On completion of the growth of the barrier layer B, the supply of TEG and $SiH_4$ into the furnace was stopped. Subsequently, the substrate temperature was lowered to 750° C., and the supply of TEG and $SiH_4$ was initiated to grow a barrier layer C. Then, the valves were again switched to stop the supply of TEG and $SiH_4$ so as to complete the growth of the GaN barrier layer. By so doing, an Si-doped GaN barrier layer of three-layered structure comprising the barrier layer A, the barrier layer B, and the barrier layer C was formed in a total thickness of 20 nm.

Through the above procedure, the light-emitting layer of the multiquantum well structure including well layers in non-uniform thicknesses (first to fourth layers) and a well layer in a uniform thickness (fifth layer) was formed.

(P-Type Layer)

On the Thus Obtained Light-Emitting Layer Having the Si-Doped GaN Barrier Layer on the top, a p-type layer composed of a p-clad layer and a p-contact layer was formed.

First, a p-clad layer made of Mg-doped p-type $Al_{0.08}Ga_{0.92}N$ was formed on the light-emitting layer. On completion of the growth of the Si-doped GaN barrier layer constituting the light-emitting layer, the substrate temperature was raised to 1050° C., the type of the carrier gas was switched to hydrogen, and the pressure in the reaction furnace was changed to 15 kPa. Time was allowed until the pressure in the reaction furnace became stable, after which the valves for the TMG, TMA, and $Cp_2Mg$ were switched to initiate the supply of these raw materials into the reaction furnace. Then, a p-clad layer made of Mg-doped p-type $Al_{0.08}Ga_{0.92}N$ was grown for about 3 minutes. Then, the supply of TMG, TMA, and $Cp_2Mg$ was stopped. By so doing, the p-clad layer made of Mg-doped p-type $Al_{0.08}Ga_{0.92}N$ was formed in a thickness of 12 nm.

Next, a p-contact layer was formed on this p-clad layer. That is, on completion of the growth of the p-clad layer, while the carrier gas and the pressure inside the furnace were kept as they were, the TMG, TMA, and Cp$_2$Mg supply amounts were changed. Thereafter, while the supply of the ammonia gas into the reaction furnace was kept continued, the valves for the TMG, TMA, and Cp$_2$Mg were again switched to initiate the supply of these raw materials into the reaction furnace. The Cp$_2$Mg amount to be circulated was examined in advance, and was adjusted so that the hole concentration of the p-contact layer made of Mg-doped p-type Al$_{0.02}$Ga$_{0.98}$N became 8×10$^{17}$ cm$^3$, after which the p-contact layer made of Mg-doped p-type Al$_{0.02}$Ga$_{0.98}$N was grown for about 12 minutes. Then, the supply of TMG, TMA, and Cp$_2$Mg was stopped. By so doing, the p-contact layer made of Mg-doped p-type Al$_{0.02}$Ga$_{0.98}$N was formed in a thickness of about 0.2 μm.

Immediately after completion of the vapor phase growth of the p-contact layer, the power supply to the high frequency induction heating system that had been used for heating the substrate was stopped, and at the same time, the carrier gas was switched from hydrogen to nitrogen, and the flow rate of ammonia was reduced. Specifically, the ammonia gas, which had accounted for about 14 volume % of the total circulation gas during the growth, was reduced to 0.2%. This state was further kept for 45 seconds, after which the circulation of ammonia was stopped. In this state, upon confirmation that the substrate temperature was lowered to room temperature, the substrate having a lamination of group III nitride semiconductors was taken out into the atmosphere. By so doing, the formation of the respective layers serving as the n-type layer, the light-emitting layer, and the p-type layer of the LED structure on the group III nitride semiconductor layer that had been produced by the same method as for Example 1 and Comparative Example 3, was completed.

Here, the p-contact layer made of Mg-doped p-type Al$_{0.02}$Ga$_{0.98}$N showed p-type properties even without the application of the annealing treatment for activating the p-type carrier.

Next, on the thus obtained substrate formed with the respective layers serving as the LED structure, a light-emitting diode, which is a type of semiconductor light-emitting device, was produced as follows.

First, by a publicly known photolithographic technique, on the p-contact layer of the substrate that had been formed with the respective layers serving as the LED structure, was formed a transparent p-electrode made of ITO. Then on the transparent p-electrode was formed a positive electrode bonding pad having a laminated structure of titanium, aluminum, and gold in this order.

Subsequently, the substrate formed with the positive electrode bonding pad was subjected to dry etching to expose the n-type layer in an area to be formed with a negative electrode bonding pad. On this exposed n-type layer was formed a negative electrode bonding pad composed of a four-layered lamination of Ni, Al, Ti, and Au.

The substrate formed with the positive electrode bonding pad and the negative electrode bonding pad by the above procedure was subjected to grinding and polishing on the backside to make a mirror-like plane. Then, the substrate was cut into a 350 μm square chip. The chip was disposed on a lead frame so that the positive electrode bonding pad and the negative electrode bonding pad faced upward, and was connected to the lead frame by gold wires to produce a light-emitting device.

The thus obtained light-emitting device was measured for reverse current (leakage current (IR)) upon application of a 20V reverse voltage. The results are shown in Table 2. In Table 2, Example 2 shows a light-emitting device obtained by using a substrate that had been produced by the same method as for Example 1 up to where the group III nitride semiconductor layer was formed, while Comparative Example 4 shows a light-emitting device obtained by using a substrate that had been produced by the same method as for Comparative Example 3 up to where the group III nitride semiconductor layer was formed.

TABLE 2

|  | Substrate used | Reverse current (μA) |
|---|---|---|
| Example 2 | Example 1 | 0.68 |
| Example 6 | Example 5 | 1.11 |
| Comparative Example 4 | Comparative Example 3 | 5.22 |

Table 1 and Table 2 show that the reverse current of the light-emitting device was excellent at 3 μA or lower in Example 2 since the crystallinity and the flatness of the group III nitride semiconductor layer produced in Example 1 were excellent.

On the other hand, the reverse current was unsatisfactory at 5 μA or higher in Comparative Example 4 since the crystallinity of the group III nitride semiconductor layer produced in Comparative Example 3 was unsatisfactory.

Example 3, Example 4, Comparative Example 5, and Comparative Example 6

Up to where the group III nitride semiconductor layer was formed by the same method as for Example 1, except that the "base portion width", "height", "base portion width/4", "interval between adjacent convex parts", and "presence/absence of C-plane on the surface of convex part" were set at values as shown in Table 3, a light-emitting device was formed by the same method as for Example 2.

The convex parts of Example 3, Example 4, and Comparative Example 6 were such that; the planar shape of the base portion was circular, the external contour became upwardly gradually smaller, and the side face had an outwardly curved bowl-shape. The convex parts of Example 3, Example 4, and Comparative Example 6 were obtained with a variation of the height of the convex part by changing the duration of etching.

Then, to the obtained light-emitting device was applied a forward current of 20 mA to measure the light emission output (Po). The results are shown in Table 3.

TABLE 3

|  | Base portion width (μm) | Height (μm) | Base portion width/4 (μm) | Interval between adjacent convex parts (μm) | Presence/absence of C-plane on the surface of convex part | Light emission output (mW) |
|---|---|---|---|---|---|---|
| Example 3 | 2.2 | 0.6 | 0.6 | 1.8 | Absent | 14.8 |
| Example 4 | 2.2 | 1.0 | 0.6 | 1.8 | Absent | 15.6 |
| Comparative Example 5 | No convex part | — | — | — | Present | 12.3 |

TABLE 3-continued

| | Base portion width (μm) | Height (μm) | Base portion width/4 (μm) | Interval between adjacent convex parts (μm) | Presence/absence of C-plane on the surface of convex part | Light emission output (mW) |
|---|---|---|---|---|---|---|
| Comparative Example 6 | 2.2 | 0.3 | 0.6 | 1.8 | Absent | 12.7 |
| Example 7 | 2.2 | 0.6 | 0.6 | 1.8 | Absent | 13.2 |
| Example 8 | 2.2 | 1.0 | 0.6 | 1.8 | Absent | 13.3 |
| Comparative Example 7 | No convex part | — | — | — | Present | 11.7 |
| Comparative Example 8 | 2.2 | 0.3 | 0.6 | 1.8 | Absent | 12.4 |

Table 3 shows that the light emission output was low at 13 mW or lower in Comparative Example 5 where no convex part was present and in Comparative Example 6 where the height of the convex part was smaller than ¼ of the base portion width.

On the other hand, the light emission output was high at 13 mW or higher in Example 3 and Example 4 where the height of the convex part was not smaller than ¼ of the base portion width.

Example 5

In Example 5, an internal layer and a ground layer were formed on the substrate in the same manner as for Example 1, except for the condition for washing the substrate surface and the condition for forming the internal layer.

That is, as will be described later, on the upper surface of the substrate that had been formed with a plurality of convex parts as with Example 1, a buffer layer of a columnar crystal aggregate (polycrystal) of AlN was formed in a thickness of 50 nm using an RF sputtering method (buffer layer formation step).

For the sputtering deposition apparatus, there was employed an apparatus having a high frequency power supply and a mechanism capable of moving a position of a magnet within a target. First, the substrate formed with a plurality of convex parts was placed in a chamber of the sputtering deposition apparatus and was heated to 750° C. Only nitrogen gas was introduced into the chamber at a flow rate of 15 sccm. Then, while the pressure in the chamber was kept at 0.08 Pa, a high frequency bias of 500 W was applied to the substrate side to thereby expose the substrate to a nitrogen plasma, by which the substrate surface was washed (pretreatment).

Subsequently, argon gas and nitrogen gas were introduced into the chamber, and the substrate temperature was lowered to 500° C. Then, under conditions where a high frequency bias of 2000 W was applied to the metal Al target side, and the pressure in the chamber was kept at 0.5 Pa, and the Ar gas was circulated at a flow rate of 15 sccm and the nitrogen gas was circulated at a flow rate of 5 sccm (nitrogen ratio to the total gas was 25%), an AlN buffer layer was formed on the substrate formed with the plurality of convex parts. The growth rate was 0.08 nm/s. The magnet in the target was shaken at both timings of the substrate washing and the buffer layer formation.

Then, the film formation was performed for a duration that had been determined in accordance with a previously measured film growth rate. On completion of the deposition of the AlN buffer layer made in a thickness of 50 nm on the substrate formed with the plurality of convex parts, the plasma operation was stopped, and the substrate temperature was lowered.

On the thus obtained buffer layer, a GaN layer was formed in the same manner as for Example 1. The surface flatness of the obtained GaN layer was observed. In addition, the full width at half maximum of the X-ray rocking curve (XRC-FWHM) of the GaN layer was measured. The results of the flatness and the full width at half maximum of the XRC (XRC-FWHM) of the GaN layer are shown in Table 1. As shown in Table 1, the results of Example 5 were equivalent to those of Example 1.

Example 6

On the group III nitride semiconductor layer that had been produced by the same method as for Example 5, a light-emitting device was produced by the same method as for Example 2.

The thus obtained light-emitting device was measured for reverse current (leakage current (IR)) upon application of a 20V reverse voltage. The results are shown in Table 2.

Table 1 and Table 2 show that the reverse current of the light-emitting device was excellent at 3 μA or lower in Example 6 since the crystallinity and the flatness of the group III nitride semiconductor layer produced in Example 5 were excellent.

Example 7, Example 8, Comparative Example 7, and Comparative Example 8

Up to where the group III nitride semiconductor layer was formed by the same method as for Example 5, except that the "base portion width", "height", "base portion width/4", "interval between adjacent convex parts", and "presence/absence of C-plane on the surface of convex part" were set at values as shown in Table 3, a light-emitting device was formed by the same method as for Example 2.

The convex parts of Example 7, Example 8, and Comparative Example 7 were such that; the planar shape of the base portion was circular, the external contour became upwardly gradually smaller, and the side face had an outwardly curved bowl-shape. In addition, the convex parts of Example 7, Example 8, and Comparative Example 7 were obtained with a variation of the height of the convex part by changing the duration of etching.

Then, to the obtained light-emitting device was applied a forward current of 20 mA to measure the light emission output (Po). The results are shown in Table 3.

Table 3 shows that the light emission output was low at 13 mW or lower in Comparative Example 7 where no convex part was present and in Comparative Example 8 where the height of the convex part was smaller than ¼ of the base portion width.

On the other hand, the light emission output was high at 13 mW or higher in Example 7 and Example 8 where the height of the convex part was not smaller than ¼ of the base portion width.

Example 9

Next, in Example 9, a light-emitting device 1 as shown in FIG. 3 (also, refer to FIG. 4) was formed, followed by the formation of a lamp 3 (light-emitting diode: LED) comprising the light-emitting device 1 as shown in FIG. 5.

In this Example, first, on the C-plane of the sapphire substrate 101 was formed a single crystal AlN layer as the buffer layer 102 using the RF sputtering method, and on this was formed a GaN (group III nitride semiconductor) layer as the ground layer 103 using the MOCVD method, by the following method, after which the respective layers were laminated.

[Formation of Buffer Layer]

First, a sapphire substrate 101 having a two-inch-diameter (0001) C-plane, the surface of which had been mirror finished, was placed in a chamber. At that time, a high frequency sputtering apparatus and a target made of metal Al were used.

The substrate 101 was heated to 500° C. in the chamber, into which nitrogen gas was introduced. Then, a high frequency bias was applied to the substrate 101 side to expose it to a nitrogen plasma, by which the surface of the substrate 101 was washed.

Next, while the temperature 101 of the substrate was kept as it was, argon gas and nitrogen gas were introduced into the sputtering apparatus. Then, under conditions where a high frequency bias was applied to the metal Al target side, and the pressure in the furnace was kept at 0.5 Pa, and the Ar gas was circulated at a flow rate of 5 sccm and the nitrogen gas was circulated at a flow rate of 15 sccm, a buffer layer 102 made of single crystal AlN was formed on the sapphire substrate 101.

Then, on completion of the formation of an AlN layer (buffer layer 102) in a thickness of 40 nm by treatment for a duration that had been determined in accordance with the previously measured film growth rate, the plasma operation was stopped, and the temperature of the substrate 101 was lowered.

Then, the buffer layer 102 formed on the substrate 101 was measured for the X-ray rocking curve (XRC) using an X-ray spectrometer (manufactured by Spectris, Product No. X'Pert PRO MRD). This measurement was performed using a CuKα X-ray source as the light source. As a result, the full width at half maximum of the XRC of the buffer layer 102 showed excellent characteristics at 0.1°, which ensured the satisfactory orientation of the buffer layer 102.

[Formation of Ground Layer]

Next, the substrate 101 formed with AlN (buffer layer 102) was taken out from the sputtering apparatus, and transferred into the MOCVD apparatus, in which a ground layer 103 made of GaN was formed on the buffer layer 102 by the following procedure.

First, the substrate 101 was placed into the reaction furnace (MOCVD apparatus). Next, nitrogen gas was circulated through the interior of the reaction furnace. Then, the heating system was activated to raise the substrate temperature from room temperature to 500° C. Then, while the substrate temperature was kept at 500° C., $NH_3$ gas and nitrogen gas were circulated. The pressure in the vapor phase growth reaction furnace was set at 95 kPa (pressure unit: Pa). Subsequently, the substrate temperature was raised to 1000° C. to effect thermal cleaning of the substrate surface. After the completion of thermal cleaning, the supply of the nitrogen gas into the vapor phase growth reaction furnace was kept continued.

Thereafter, while the circulation of the ammonia gas was kept continued, the substrate temperature was raised to 1100° C. in the hydrogen atmosphere, and the pressure in the reaction furnace was set at 40 kPa. Upon confirmation of a stable substrate temperature at 1100° C., a supply of trimethylgallium (TMG) into the vapor phase growth reaction furnace was initiated to start a step of forming a group III nitride semiconductor (GaN) layer serving as the ground layer 103 on the buffer layer 102. On completion of the growth of GaN in this manner, the valve for the TMG pipe was switched to stop the supply of the raw material into the reaction furnace to complete the growth of GaN.

Through the above process, the ground layer 103 made of undoped GaN was formed in a thickness of 8 μm on the buffer layer 102 having a single crystal structure of AlN that had been formed on the substrate 101.

[Formation of n-Contact Layer]

Subsequently after the formation of the ground layer 103, an initial layer of the GaN n-contact layer 104a was formed using the same MOCVD apparatus. At that time, the n-contact layer 104a was doped with Si. The crystal growth was performed under the same condition as that of the ground layer, except that $SiH_4$ was circulated as an Si dopant source.

Through the above process, on the sapphire substrate 101 to the surface of which reverse sputtering had been applied, was formed the buffer layer 102 having a single crystal structure of AlN, on which, the undoped GaN layer (n-type ground layer 103) was formed in a thickness of 8 μm, and the Si-doped GaN layer (initial layer serving as the n-contact layer 104a) having a carrier concentration of $5 \times 10^{18}$ $cm^{-3}$ was formed in a thickness of 2 μm. The substrate taken out from the apparatus after the film formation was transparent and colorless, and the surface of the GaN layer (here, the initial layer serving as the n-contact layer 104a) was a mirror plane.

The Si-doped GaN layer formed as described above was measured for the X-ray rocking curve (XRC) using an X-ray spectrometer (manufactured by Spectris, Product No. X'Pert PRO MRD). This measurement was performed for the (0002) plane serving as the symmetry plane and the (10-10) plane serving as a nonsymmetry plane, using a Cuβ X-ray source as the light source. Generally, in cases of a group III nitride compound semiconductor, the full spectral width at half maximum of the XRC of the (0002) plane indicates the flatness of the crystal (mosaicity), and the full spectral width at half maximum of the XRC of the (10-10) plane indicates the density of dislocations (twisting). As a result of this measurement, the Si-doped GaN layer (n-contact layer) produced by the production method of the present invention showed full widths at half maximum of 46 arcsec for the (0002) plane, and 220 arcsec for the (10-10) plane.

[Formation of n-Clad Layer and Light-Emitting Layer]

On the n-contact layer 104a that had been produced by the above procedure were laminated an n-clad layer 104b and a light-emitting layer 105 by the MOCVD method.

[Formation of n-Clad Layer 104b]

The substrate on which the n-contact layer 104a had been grown by the above procedure, was placed in the MOCVD apparatus. Then, while ammonia was being circulated and nitrogen was used as the carrier gas, the substrate temperature was lowered to 760° C.

At that time, while the temperature inside the furnace was being changed, the $SiH_4$ supply amount was set. The $SiH_4$ amount to be circulated was calculated in advance, and was adjusted so that the electron concentration of the Si-doped layer became $4 \times 10^{18}$ $cm^{-3}$. The supply of ammonia into the furnace was kept continued at the unchanged flow rate.

Next, while ammonia was being circulated through the interior of the chamber, an $SiH_4$ gas and TMI and TEG steams that had been generated by bubbling were circulated in the furnace to form a $Ga_{0.99}In_{0.01}N$ layer in a thickness of 1.7 nm, and a GaN layer in a thickness of 1.7 nm, respectively. After nineteen cycles repetition of such a film formation process, a $Ga_{0.99}In_{0.01}N$ layer was again grown in a thickness of 1.7 nm on the top. In addition, during this process, the circulation of $SiH_4$ was kept continued. By so doing, the n-clad layer 104b having a superlattice structure of Si-doped $Ga_{0.99}In_{0.01}N$ and GaN was formed.

[Formation of Light-Emitting Layer]

The light-emitting layer 105 has a multiquantum well structure composed of GaN barrier layers 105a and $Ga_{0.92}In_{0.08}N$ well layers 105b. Upon formation of this light-emitting layer 105, firstly a barrier layer 105a was formed on the n-clad layer 104c having a superlattice structure of Si-doped GaInN and GaN, and then an $In_{0.2}Ga_{0.8}N$ well layer 105b was formed on this barrier layer 105a. After six times repetition of such a lamination procedure, a seventh barrier layer 105a was formed on the sixth well layer 105b, to make a structure in which barrier layers 105a were disposed on both sides of the light-emitting layer 105 of the multiquantum well structure.

First, while the substrate temperature was kept at 760° C., a supply of TEGa and $SiH_4$ into the furnace was initiated to form an initial barrier layer made of Si-doped GaN of 0.8 nm for a predetermined time. Then, the supply of TEGa and $SiH_4$ was stopped. Thereafter, the susceptor temperature was raised to 920° C. Then, while the substrate temperature was kept at 920° C., the supply of TEGa and $SiH_4$ into the furnace was again initiated to grow an internal barrier layer of 1.7 nm. Then, the supply of TEGa and $SiH_4$ into the furnace was stopped. Subsequently, the susceptor temperature was lowered to 760° C., and the supply of TEGa and $SiH_4$ was initiated to further form a terminal barrier layer of 3.5 nm. Then, the supply of TEGa and $SiH_4$ was again stopped to complete the growth of the GaN barrier layer. By the above three-step film formation process, an Si-doped GaN barrier layer (barrier layer 105a) having a three-layered structure composed of the initial barrier layer, the internal barrier layer, and the terminal barrier layer was formed in a total thickness of 6 nm. The $SiH_4$ amount was adjusted so that the Si concentration became $1\times10^{17}$ $cm^{-3}$.

On completion of the growth of the GaN barrier layer (barrier layer 105a), TEGa and TMIn were supplied into the furnace to perform a well layer formation process, by which a $Ga_{0.92}In_{0.08}N$ layer (well layer 105b) was formed in a thickness of 3 nm.

Then, on completion of the growth of the $Ga_{0.92}In_{0.08}N$ well layer 105b, the setting of the TEGa supply amount was changed. Subsequently, the supply of TEGa and $SiH_4$ was again initiated to form the second barrier layer 105a.

Through six times repetition of this procedure, six barrier layers 105a made of Si-doped GaN and six well layers 105b made of $Ga_{0.92}In_{0.08}N$ were formed.

Then, subsequently after the formation of the sixth $Ga_{0.92}In_{0.08}N$ well layer 105b, the seventh barrier layer was formed. In the formation process of the seventh barrier layer, first, the supply of $SiH_4$ was stopped to form an undoped GaN initial barrier layer. Then, while the supply of TEGa into the furnace was kept continued, the substrate temperature was raised to 920° C. to thereby grow an internal barrier layer at this substrate temperature of 920° C. for a predetermined time. Then, the supply of TEGa into the furnace was stopped. Subsequently, the substrate temperature was lowered to 760° C., and the supply of TEGa was initiated to grow a terminal barrier layer. Then, the supply TEGa was again stopped so as to complete the growth of the GaN barrier layer. By so doing, an undoped GaN barrier layer having a three-layered structure of the initial barrier layer, the internal barrier layer, and the terminal barrier layer was formed in a total thickness of 4 nm (refer to the barrier layer 105a on the top-end of the light-emitting layer 105 in FIG. 4).

Through the above procedure, the light-emitting layer 105 of the multiquantum well structure including well layers in non-uniform thicknesses (first to fifth well layers 105b from the side of the n-type layer 104 in FIG. 4) and a well layer in a uniform thickness (sixth well layer 105 from the side of the n-type layer 104 in FIG. 4) was formed.

[Formation of p-Type Semiconductor Layer]

Subsequently after the above respective procedures, using the same MOCVD apparatus, a p-clad layer 106a having a superlattice structure composed of four-layered non-doped $Al_{0.06}Ga_{0.94}N$ and three-layered Mg-doped GaN was formed, on which, a Mg-doped GaN p-contact layer 106b was formed in a thickness of 200 nm to thereby make a p-type semiconductor layer 106.

First, while the $NH_3$ gas was being supplied, the substrate temperature was raised to 975° C. Then, at this temperature, the carrier gas was switched from nitrogen to hydrogen. Subsequently, the substrate temperature was changed to 1050° C. Then, TMGa and TMAl were supplied into the furnace to thereby form a non-doped $Al_{0.06}Ga_{0.94}N$ layer in a thickness of 2.5 nm. Subsequently without an interval, the valve for the TMAl was closed and the valve for the $Cp_2Mg$ was opened to form an Mg-doped GaN layer in a thickness of 2.5 nm.

The above operation was repeated three times, and an undoped $Al_{0.06}Ga_{0.94}N$ layer was formed on the top to thereby form the p-clad layer 106a of a superlattice structure.

Thereafter, only $Cp_2Mg$ and TMGa were supplied into the furnace to form a p-contact layer 106b made of p-type GaN in a thickness of 200 nm.

The epitaxial wafer for an LED produced in the above manner has a structure in which, on the sapphire substrate 101 having the C-plane is formed the AlN layer (buffer layer 102) having a single crystal structure, followed by the lamination of, sequentially from the substrate 101 side: the 8 μm undoped GaN layer (ground layer 103); the n-contact layer 104a having an electron concentration of $5\times10^{18}$ $cm^{-3}$ composed of 2 μm Si-doped GaN initial layer and a 200 nm Si-doped GaN regrown layer; the clad layer (n-clad layer 104b) having an Si concentration of $4\times10^{18}$ $cm^{-3}$ and having a superlattice structure composed of twenty layers of 1.7 nm $Ga_{0.99}In_{0.01}N$ and nineteen layers of 1.7 nm GaN; a multiquantum well structure (light-emitting layer 105) composed of six Si-doped GaN barrier layers (barrier layers 105a) in a thickness of 6 nm with GaN barrier layers disposed at both ends, six non-doped $Ga_{0.92}In_{0.08}N$ well layers (well layers 105b) in a thickness of 3 nm, and the top-end barrier layer comprising the non-doped GaN terminal barrier layer (refer to the barrier layer 105a on the top of the light-emitting layer 105 in FIG. 4); and the p-type semiconductor layer 106 composed of the p-clad layer 106a having a superlattice structure of four 2.5 nm non-doped $Al_{0.06}Ga_{0.94}N$ layers and four 2.5 nm Mg-doped $Al_{0.01}Ga_{0.99}N$ layers, and the 200 nm Mg-doped GaN p-contact layer 106b.

Example 10

An epitaxial wafer for an LED, in which the n-type semiconductor layer 104, the light-emitting layer 105, and the p-type semiconductor layer 106 were sequentially laminated, was produced by the same operating procedure as for Example 9, except that the barrier layer formed on the top, amongst the seven barrier layers 105a, was not doped in the step of forming the light-emitting layer 105 as described in Example 9.

Example 11

An epitaxial wafer for an LED was produced by the same operating procedure as for Example 9, except that the step of forming the p-type semiconductor layer 106 on the light-emitting layer 105 as described in Example 9 and Example 10 was carried out in the following procedure.

In this Example, using the same MOCVD apparatus that had been used for the formation of the light-emitting layer 105, on the light-emitting layer 105 was formed a p-type clad layer 106a having a superlattice structure of four non-doped $Al_{0.06}Ga_{0.94}N$ layers and three Mg-doped $Al_{0.01}Ga_{0.99}$ layers, by appropriately adjusting the supply amounts of TMGa, TMAl, and $Cp_2Mg$, and on this was further formed a Mg-doped GaN p-type contact layer 106b in a thickness of 200 nm to make the p-type semiconductor layer 106.

Example 12

Next, an LED was produced using the epitaxial wafer for an LED that had been obtained by the method of each Example mentioned above.

That is, for example, on the surface of the Mg-doped GaN layer (p-contact layer 106b) of the abovementioned epitaxial wafer was formed an IZO transparent positive electrode 109 by a publicly known photolithographic method, and on this was formed a positive electrode bonding pad 107 (p-electrode bonding pad) having a laminated structure of chromium, titanium, and gold in this order, for use as a p-side electrode. Furthermore, the wafer was dry-etched to expose an area to be formed with an n-side electrode (negative electrode) of the n-contact layer 104b. On this exposed area was formed a negative electrode 108 (n-side electrode) composed of a three-layered lamination of Cr, Ti, and Au in this order. By such a procedure, on the wafer were formed the respective electrodes in the shape as shown in FIG. 3.

Then, the wafer formed with the respective p-side and n-side electrodes by the above procedure was subjected to grinding and polishing on the backside of the sapphire substrate 101 to make a mirror-like plane. Then, the wafer was cut into a 350 μm square chip to produce a light-emitting device 1 as shown in FIG. 3. Then, the wafer was disposed on a lead frame so that the respective electrodes faced upward, and was connected to the lead frame by gold wires to produce a light-emitting diode (LED) (refer to the lamp 3 of FIG. 5). A forward current was applied to between the p-side and n-side electrodes of the light emitting diode produced in the above manner. As a result, the forward voltage at a current of 20 mA was 3.1 V. In addition, the emitting state was observed through the p-side transparent positive electrode 109, which showed that the emission wavelength was 460 nm and the emission output was 20 mW. Such characteristics of the light emitting diode were uniformly obtained for the light emitting diode that was produced from almost the entire surface of the thus produced wafer.

INDUSTRIAL APPLICABILITY

The method for producing a group III nitride semiconductor layer of the present invention has industrial applicability because of its usability in the field of production of light-emitting devices such as a light emitting diode (LED). In addition, the group III nitride semiconductor light-emitting device of the present invention and the lamp of the present invention have high industrial applicability because they can be applied to various versatile products such as electronic equipment.

The invention claimed is:

1. A method for producing a group III nitride semiconductor light-emitting device in which a single crystal group III nitride semiconductor layer is formed on a sapphire substrate, the method comprising:
    a substrate processing step of forming a mask on the (0001) C-plane of the substrate and performing dry etching and wet etching, to thereby form, on the substrate, an upper surface that is composed of a flat surface of the C-plane and a plurality of convex parts having inclined planes constituting the side faces on which crystal planes are exposed;
    a buffer layer formation step of laminating a buffer layer of $Al_xGa_{1-x}N$ ($0 \leq x \leq 1$) on the upper surface after the substrate processing step; and
    an epitaxial step of epitaxially growing the group III nitride semiconductor layer on the buffer layer by an MOCVD method, to thereby embed the convex parts in the group III nitride semiconductor layer, wherein
    the substrate processing step forms the convex part that has a shape whose external contour becomes upwardly gradually smaller and a surface which does not have a surface parallel to the (0001) C-plane within a range of ±3°,
    the convex part has a base portion width of 0.05 to 5 μm and a height of 0.05 to 5 μm,
    the height is not smaller than ¼ of the base portion width, and
    an interval between the adjacent convex parts is 0.05 to 5 times the base portion width.

2. The method for producing a group III nitride semiconductor light-emitting device according to claim 1, wherein a buffer layer formation step laminates the buffer layer in a thickness of 0.01 to 0.5 μm by a sputtering method.

* * * * *